(12) United States Patent
Kinoshita et al.

(10) Patent No.: US 8,604,456 B2
(45) Date of Patent: Dec. 10, 2013

(54) NONVOLATILE MEMORY DEVICE AND METHOD OF MANUFACTURING THE SAME

(75) Inventors: Masaharu Kinoshita, Kokubunji (JP);
Yoshitaka Sasago, Tachikawa (JP);
Norikatsu Takaura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 95 days.

(21) Appl. No.: 13/366,544

(22) Filed: Feb. 6, 2012

(65) Prior Publication Data

US 2012/0132879 A1  May 31, 2012

Related U.S. Application Data

(62) Division of application No. 12/434,633, filed on May 2, 2009, now Pat. No. 8,129,705.

(30) Foreign Application Priority Data

Aug. 6, 2008   (JP) .................................. 2008-202771

(51) Int. Cl.
*H01L 45/00*   (2006.01)

(52) U.S. Cl.
USPC ............ 257/1; 257/2; 257/316; 257/E45.002; 257/E47.002

(58) Field of Classification Search
USPC .................. 257/1, 2, 4, 5, 316, 773, E21.351, 257/E45.002, E47.001, E47.002; 365/163
See application file for complete search history.

(56) References Cited

U.S. PATENT DOCUMENTS

| | | | |
|---|---|---|---|
| 6,579,760 | B1 | 6/2003 | Lung |
| 6,740,921 | B2 | 5/2004 | Matsuoka et al. |
| 6,750,469 | B2 | 6/2004 | Ichihara et al. |
| 7,541,252 | B2 | 6/2009 | Eun et al. |
| 7,821,086 | B2 | 10/2010 | Kajiyama |
| 2008/0002455 | A1 | 1/2008 | Toda et al. |
| 2009/0127538 | A1 | 5/2009 | Ryoo et al. |
| 2009/0201715 | A1 | 8/2009 | Kreupl |

FOREIGN PATENT DOCUMENTS

| | | |
|---|---|---|
| JP | 2005-536052 A | 11/2005 |
| JP | 2007-019559 A | 1/2007 |
| JP | 2007-194426 A | 8/2007 |
| WO | WO 2004/017437 A1 | 2/2004 |

*Primary Examiner* — Whitney T Moore
(74) *Attorney, Agent, or Firm* — Miles & Stockbridge P.C.

(57) ABSTRACT

Provided is a nonvolatile memory device including a phase-change memory configured with cross-point memory cells in which memory elements formed of a phase-change material and selection elements formed with a diode are combined. A memory cell is configured with a memory element formed of a phase-change material and a selection element formed with a diode having a stacked structure of a first polycrystalline silicon film, a second polycrystalline silicon film, and a third polycrystalline silicon film. The memory cells are arranged at intersection points of a plurality of first metal wirings extending along a first direction with a plurality of third metal wirings extending along a second direction orthogonal to the first direction. An interlayer film is formed between adjacent selection elements and between adjacent memory elements, and voids are formed in the interlayer film provided between the adjacent memory elements.

5 Claims, 41 Drawing Sheets

NONVOLATILE MEMORY DEVICE AND METHOD OF MANUFACTURING THE SAME

CROSS-REFERENCE TO RELATED APPLICATION

The present application is a division of application Ser. No. 12/434,633 filed May 2, 2009. This application also claims priority from Japanese Patent Application No. JP 2008-202771 filed on Aug. 6, 2008, the content of which is hereby incorporated by reference into this application.

TECHNICAL FIELD OF THE INVENTION

The present invention relates to a nonvolatile memory device and a method of manufacturing the same. More particularly, the present invention relates to a technique effectively applied to a nonvolatile memory device comprising a phase-change memory that stores a resistance value determined by a phase change between a crystalline state and an amorphous state of a metal compound in a nonvolatile manner and is electrically rewritable, and a manufacture of the nonvolatile memory device.

BACKGROUND OF THE INVENTION

Some nonvolatile storage/memory devices utilize a crystalline state and an amorphous state of a metal compound as storage/memory information and a tellurium compound is typically used as its storage/memory material. The principle thereof is that a difference between a reflectivity of the crystalline state and a reflectivity of the amorphous state of the metal compound is stored as information, which is widely used in optical information storage/memory media such as DVD (Digital Versatile Disk).

In recent years, there has been proposed to use a metal compound for an electric information storage/memory medium. The method of using a metal compound for an electric information storage/memory medium is, unlike the optical method described above in which a metal compound is used for an optical information storage/memory medium, an electric method of detecting a difference in an electric resistance between the crystalline state and the amorphous state of the metal compound, that is a difference between a low resistance state of crystal and a high resistance state of amorphia on the basis of the amount of current or a change in voltage. For example, U.S. Pat. No. 6,750,469 (Patent Document 1) discloses an electric information memory medium using a metal compound called phase-change memory or phase-change type memory.

A structure of a basic memory cell of the phase-change memory is configured such that a memory element (phase-change material) and a selection element are combined. The phase-change memory stores and holds information by making the memory element into the crystalline state or the amorphous state by Joule heat generated in the memory element by applying a current from the selection element. The rewriting can be performed such that, in the case of obtaining the amorphous state with an electrically high resistance, a high current is applied to set a temperature of the memory element to be higher than a melting point and then rapidly cooling down the memory element. In the case of obtaining the crystalline state with an electrically low resistance, the current to be applied is restricted to set the temperature of the memory element to be a crystallization temperature lower than the melting point. Generally, the resistance value of the memory element is changed by 2 digits or 3 digits according to the phase change. Thus, the phase-change memory has a read signal to be largely different depending on whether the memory element is in the crystalline state or the amorphous state and is thus easy to perform a sensing operation.

For example, U.S. Pat. No. 6,579,760 (Patent Document 2) discloses a phase-change memory having cross-point memory cells which can be manufactured at a low cost.

SUMMARY OF THE INVENTION

The cross-point memory cell needs to use a diode as selection element in order to prevent erroneous information from being written. As described above, a current is flowed from the diode as selection element to a phase-change material as memory element so that information in the memory cell is rewritten. This fact means that the phase-change material becomes higher in its temperature in order to change the crystalline state while the diode also becomes higher in its temperature due to its resistance.

However, when the diode is at a high temperature, an impurity profile inside the diode breaks, which causes a problem that the OFF current required for appropriate reading can not be maintained or the diode itself is thermally broken down. It is also possible to use a material having a high thermal conductivity for a material of the diode not to make the diode to be a high temperature, but in this case, there will be caused a problem that a high current is required to set the phase-change material at a high temperature or the required high temperature is not reached to make information rewriting difficult. Thus, an object of the cross-point memory cell is to develop a memory cell structure in which the diode is less likely to be at a high temperature at the time of rewriting and the phase-change material is likely to at a high temperature.

It is an object of the present invention to provide a technique capable of realizing a memory cell structure in which a diode is less likely to become a high temperature even when the phase-change material is set at a high temperature in a nonvolatile memory device comprising a phase-change memory configured by cross-point memory cells in which a memory element formed of a phase-change material and a selection element formed of a diode are combined.

The above and other objects and novel characteristics of the present invention will be apparent from the description of the present specification and the accompanying drawings.

One typical aspects of the inventions disclosed in the present application will be briefly described as follows.

An aspect is a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. The memory cell is configured with the selection element provided on the first metal wiring, the memory element provided on the selection element, a second metal wiring provided on the memory element, and the third metal wiring provided on the second metal wiring, wherein an interlayer film is formed between the adjacent selection elements and between the adjacent memory elements, and a void is formed in the interlayer film provided between the adjacent memory elements.

In addition, an aspect is a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. The memory cell is configured with the selection element provided on the first metal wiring, the memory element provided on the selection element, a second metal wiring provided on the memory element, and the third metal wiring provided on the second metal wiring, wherein an interlayer film having a lower thermal conductivity than the interlayer film provided between the adjacent selection elements is provided between the adjacent memory elements.

In addition, an aspect is a method of manufacturing a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. At first, a first metal film, a selection element material, a buffer layer, a phase-change material, and a second metal film are sequentially formed on a semiconductor substrate. Then, the second metal film, the phase-change material, the buffer layer, the selection element material, and the first metal film are sequentially etched along the first direction to be processed to make the phase-change material into a stripe shape having a width narrower than a width of the buffer layer or the selection element material. Subsequently, with forming a void between the adjacent phase-change materials, a first interlayer film is filled between adjacent stacked patterns formed of the second metal film, the phase-change material, the buffer layer, the selection element material, and the first metal film. Subsequently, a surface of the first interlayer film is polished to expose an upper surface of the second metal film, and then a third metal film is formed on the semiconductor substrate. Further, the third metal film, the second metal film, the phase-change material, the buffer layer, and the selection element material are sequentially etched along the second direction to be processed to make the phase-change material into a stripe shape having a width narrower than the width of the buffer layer or the selection element material. Subsequently, with forming a void between the adjacent phase-change materials, a second interlayer film is filled between adjacent stacked patterns formed of the third metal film, the second metal film, the phase-change material, the buffer layer, the selection element material, and the first metal film.

In addition, an aspect is a method of manufacturing a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. At first, a first metal film, a selection element material, a buffer layer, a phase-change material, and a second metal film are sequentially formed on a semiconductor substrate. Then, the second metal film, the phase-change material, the buffer layer, the selection element material, and the first metal film are sequentially etched along the first direction to be processed to make the phase-change material into a stripe shape. Subsequently, after the second metal film and the phase-change material are processed to be thin along the first direction, side surfaces of the second metal film and the phase-change material are coated and a first interlayer film to fill between adjacent stacked patterns formed of the buffer layer, the selection element material, and at the same time the first metal film is formed. Subsequently, after the first interlayer film is etched back, a space occurring due to a coatability of the first interlayer film is filled with the second interlayer film having a lower thermal conductivity than the first interlayer film. Subsequently, after the surface of the second interlayer film is polished to expose the upper surface of the second metal film, the third metal film is formed on the semiconductor substrate. Further, the third metal film, the second metal film, the phase-change material, the buffer layer, and the selection element material are sequentially etched along the second direction to be processed into a stripe shape. Subsequently, after the second metal film and the phase-change material are processed to be thin along the second direction, side surfaces of the second metal film and the phase-change material are coated, and at the same time a third interlayer film is formed to fill between the adjacent stacked patterns formed of the buffer layer, the selection element material, and the first metal film. Subsequently, after the third interlayer film is etched back, a space occurring due to a coatability of the third interlayer film is filled with a fourth interlayer film having a lower thermal conductivity than the third interlayer film.

In addition, an aspect is a method of manufacturing a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. At first, a first metal film, a selection element material, a buffer layer, a phase-change material, and a second metal film are sequentially formed on a semiconductor substrate. Then, the second metal film, the phase-change material, the buffer layer, the selection element material, and the first metal film are sequentially etched along the first direction to be processed to make the phase-change material into a stripe shape. Subsequently, after the second metal film and the phase-change material are processed to be thin along the first direction, a first interlayer film to fill between adjacent stacked patterns formed of the buffer layer, the selection element material, and at the same time the first metal film is formed. Subsequently, the first interlayer film is etched back to remove the first interlayer film between the adjacent stacked patterns of the second metal film and the phase-change material. Subsequently, after the second interlayer film having a lower thermal conductivity than the first interlayer film is filled between the adjacent stacked patterns of the second metal film and the phase-change material, a surface of the second interlayer film is polished to expose an upper surface of the second metal film, and a third metal film is formed on the semiconductor substrate. Further, the third metal film, the second metal film, the phase-change material, the buffer layer, and the selection element material are sequentially etched along the second direction to be processed into a stripe shape. Subsequently, after the second metal film and the phase-change material are processed to be thin along the second direction, a third interlayer film is formed to fill between the adjacent stacked patterns of the third metal film, the second metal film, the phase-change material, the buffer layer, the selection element material and the first metal film. Subsequently, the third interlayer film is etched back to remove the third interlayer film between the adjacent stacked patterns of the second metal film and the phase-change material. Subsequently, a fourth interlayer film having a lower thermal conductivity than the third interlayer film is filled between the adjacent stacked patterns of the second metal film and the phase-change material.

In addition, an aspect is a method of manufacturing a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. At first, after a first metal film, a selection element material, a buffer layer, a phase-change material, and a second metal film are sequentially formed on a semiconductor substrate, the second metal film, the phase-change material, the buffer layer, the selection element material, and the first metal film are sequentially etched along the first direction to be processed into a stripe shape. Subsequently, after the second metal film and the phase-change material are processed to be thin along the first direction, an upper side of the buffer layer is processed to make its width narrower than a width of the lower side of the buffer layer. Subsequently, side surfaces of the second metal film and the phase-change material are coated, and at the same time the first interlayer film is formed to fill between adjacent stacked patterns of the buffer layer, the selection element material, and the first metal film, and a space occurring due to a coatability of the first interlayer film is filled with the second interlayer film having a lower thermal conductivity than the first interlayer film. Subsequently, after surfaces of the first interlayer film and the second interlayer film are polished to expose the upper surface of the second metal film, a third metal film is formed on the semiconductor substrate. Further, the third metal film, the second metal film, the phase-change material, the buffer layer, and the selection element material are sequentially etched along the second direction to be processed into a stripe shape. Subsequently, after the second metal film and the phase-change material are processed to be thin along the second direction, the upper side of the buffer layer is processed to make its width narrower than the width of a lower side of the buffer layer. Subsequently, the side surfaces of the second metal film and the phase-change material are coated, and at the same time a third interlayer film is formed to fill between the adjacent stacked patterns of the buffer layer, the selection element material, and the first metal film, and a space occurring due to a coatability of the third interlayer film is filled with a fourth interlayer film having a lower thermal conductivity than the third interlayer film.

In addition, an aspect is a method of manufacturing a nonvolatile memory device having a phase-change memory which includes cross-point memory cells configured with a plurality of first metal wirings extending along a first direction, a plurality of third metal wirings extending along a second direction orthogonal to the first direction, and memory elements and selection elements at intersection points of the first metal wirings and the third metal wirings. At first, after a first metal film, a selection element material, and a first buffer layer are sequentially formed on a semiconductor substrate, the first buffer layer, the selection element material, and the first metal film are sequentially etched along the first direction to be processed into a stripe shape. Subsequently, a first interlayer film is formed on the semiconductor substrate to embed between adjacent stacked patterns consisting of the first buffer layer, the selection element material and the first metal film, the surface of the first interlayer film is polished and the upper surface of the first buffer layer is exposed. Subsequently, the first buffer layer and the selection element material are sequentially etched along the second direction to be processed into a stripe shape. Subsequently, after the second interlayer film is formed on the semiconductor material to fill between the adjacent stacked patterns of the first buffer layer, the selection element material, and the first metal film, a surface of the second interlayer film is polished to expose the upper surface of the first buffer layer. Further, after a second buffer layer, the phase-change material, and the second metal film are sequentially formed on the semiconductor substrate, the second metal film, the phase-change material and the second buffer layer are sequentially etched along the first direction to be processed into a stripe shape. Subsequently, after a third interlayer film having a lower thermal conductivity than the first or second interlayer film is formed on the semiconductor substrate to fill between the adjacent stacked patterns of the second metal film, the phase-change material, and the second buffer layer, a surface of the third interlayer film is polished to expose an upper surface of the second metal film. Subsequently, the second metal film, the phase-change material, and the second buffer layer are sequentially etched along the second direction to be processed into a stripe shape. Subsequently, after a fourth interlayer film having a lower thermal conductivity than the first or second interlayer film is formed on the semiconductor substrate to fill between the adjacent stacked patterns of the second metal film, the phase-change material, and the second buffer layer, a surface of the fourth interlayer film is polished to expose the upper surface of the second metal film. Subsequently, a third metal film is formed on the semiconductor substrate and processed into a stripe shape along the second direction.

The effects obtained by typical aspects of the present invention will be briefly described below.

It is possible to realize a memory cell structure in which a diode is less likely to be at a high temperature even when a phase-change material is set at a high temperature.

BRIEF DESCRIPTIONS OF THE DRAWINGS

Figure 21:
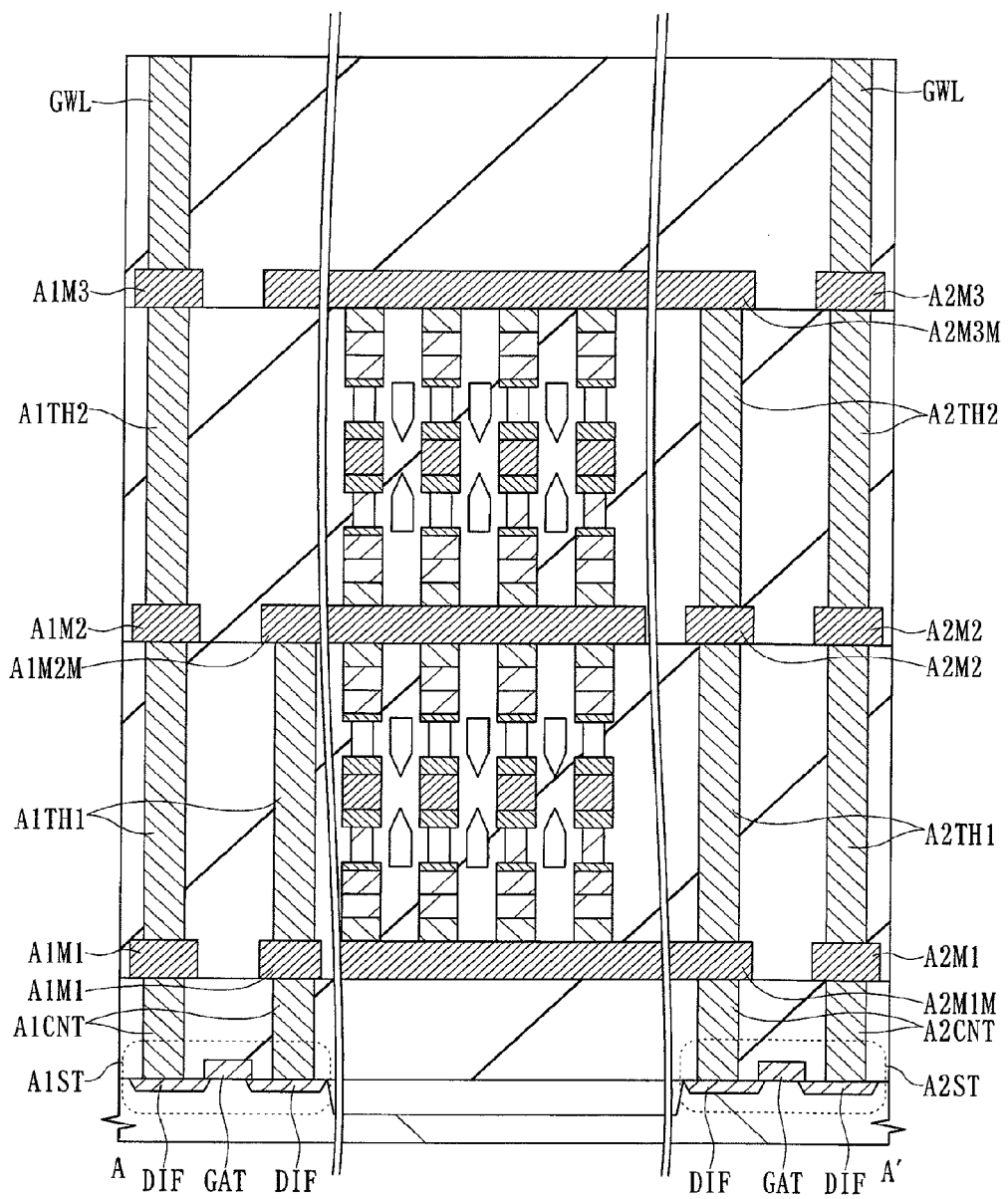
Figure 22:
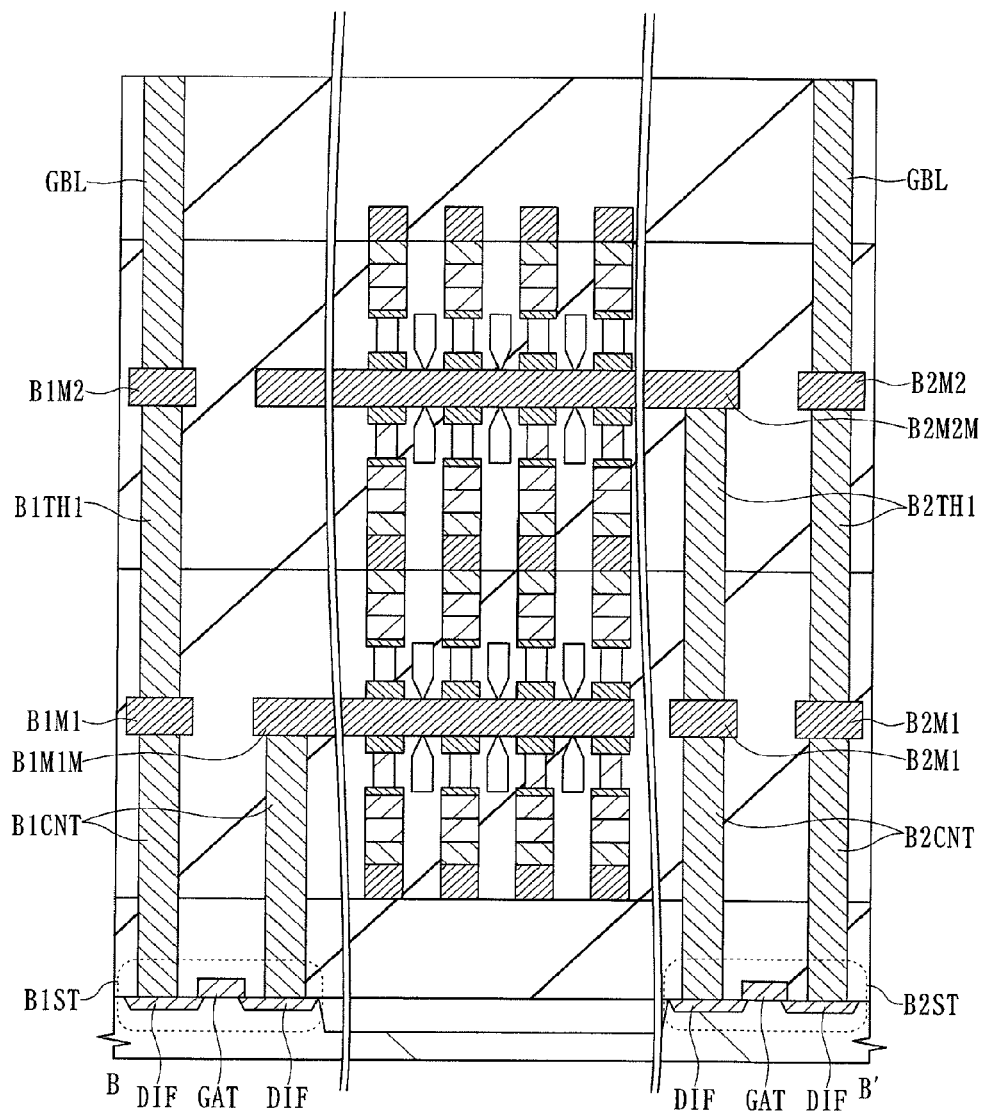
Figure 23:
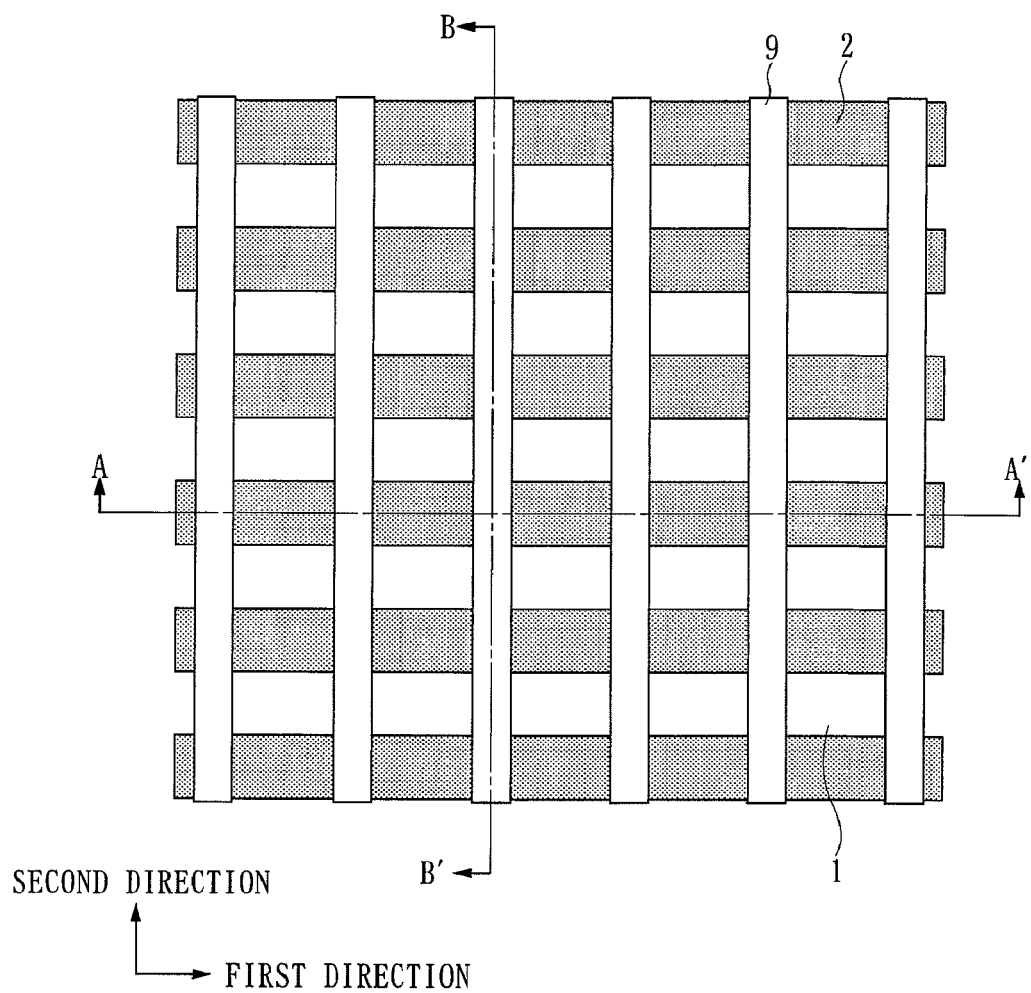
Figure 24:
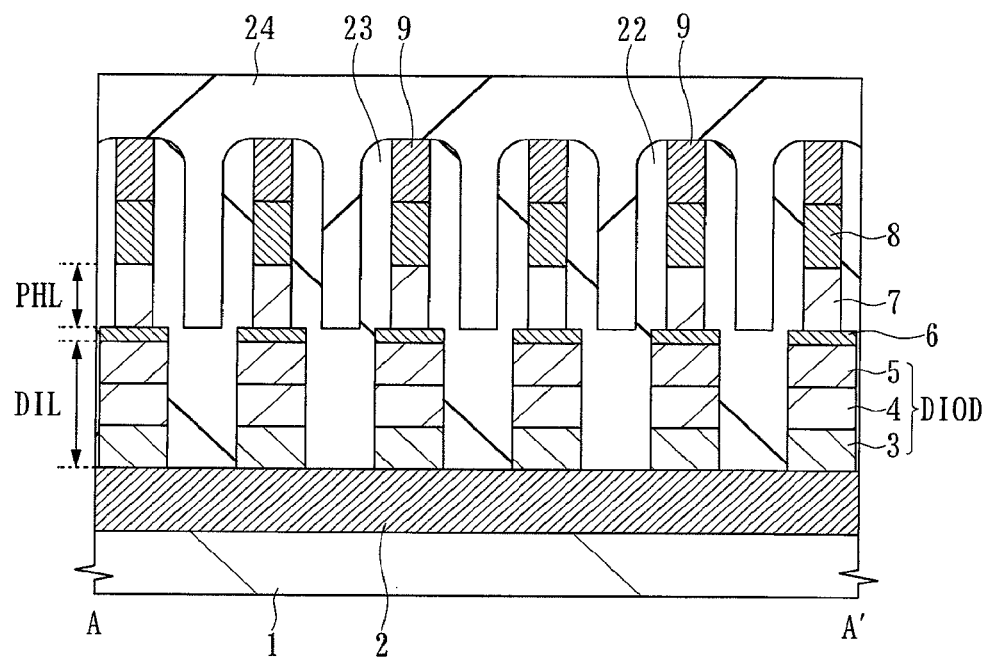
Figure 25:
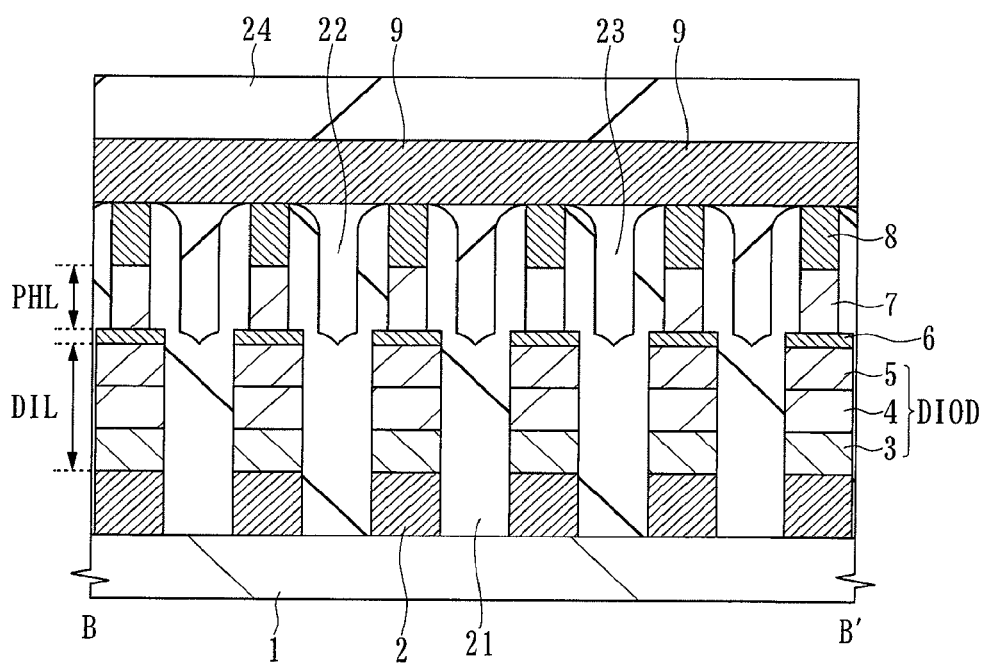
Figure 26:
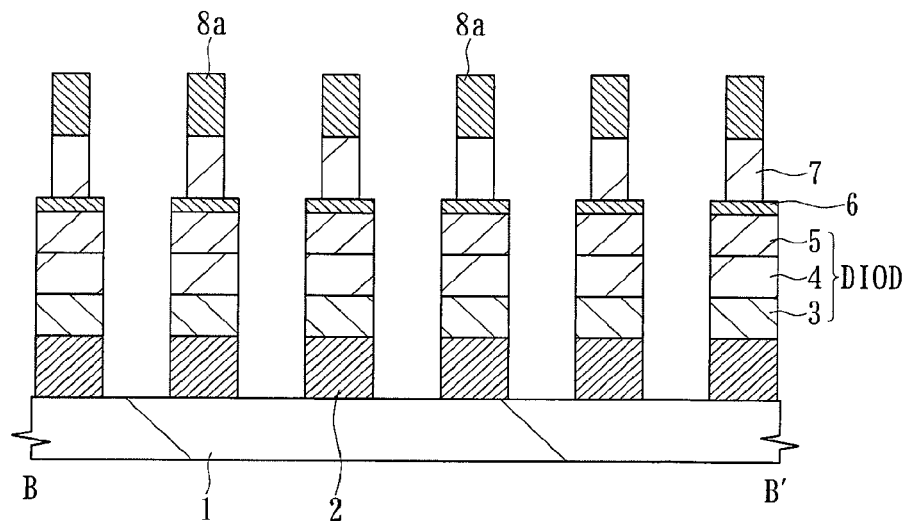
Figure 27:
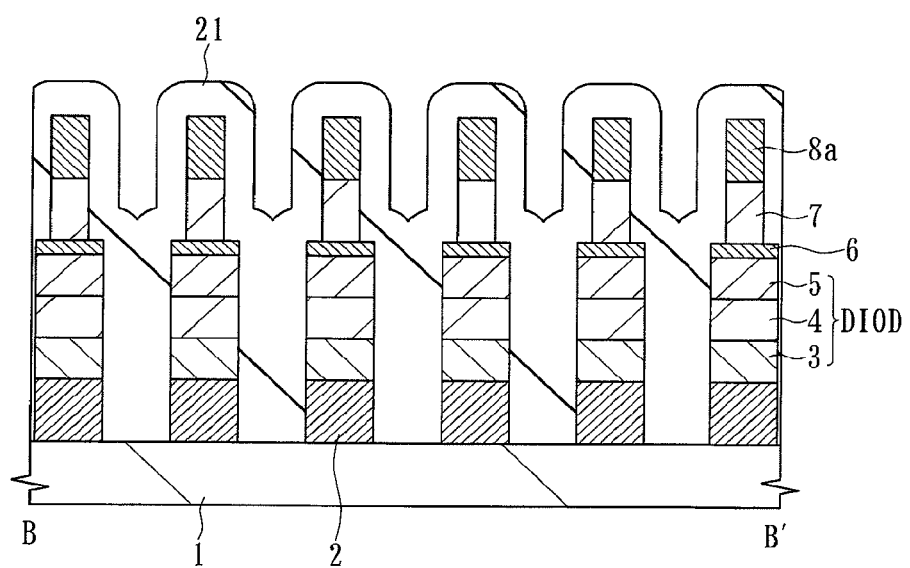
Figure 28:
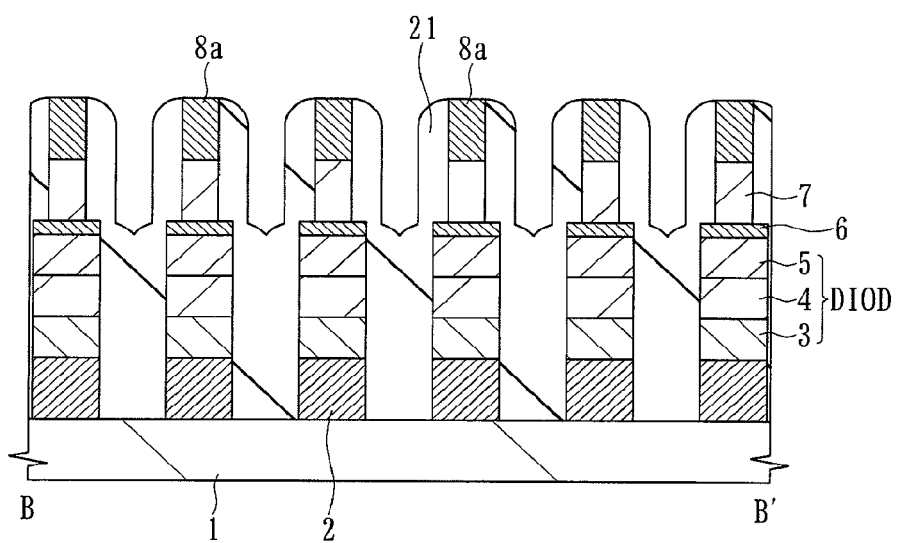
Figure 29:
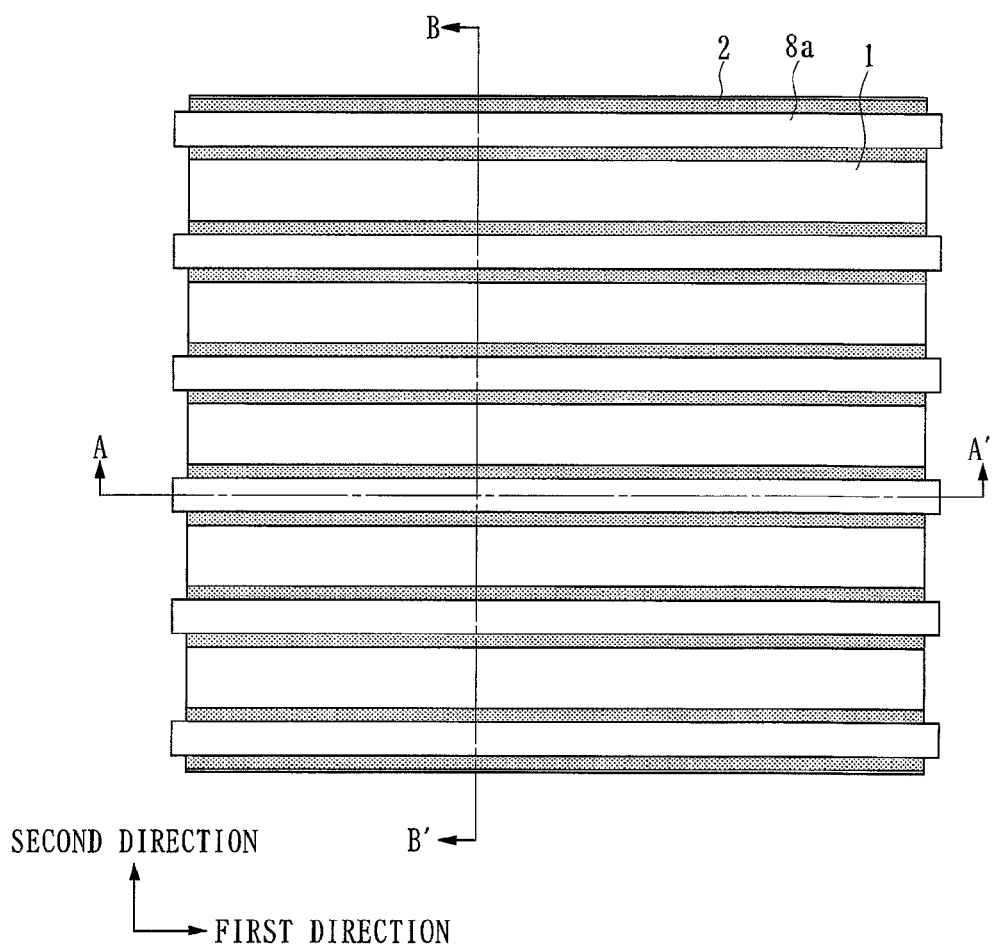
Figure 30:
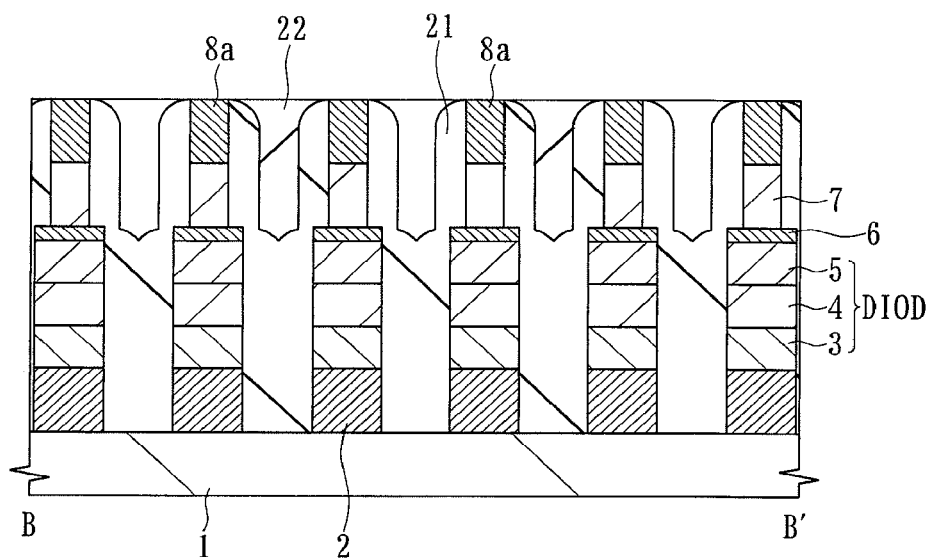
Figure 31:
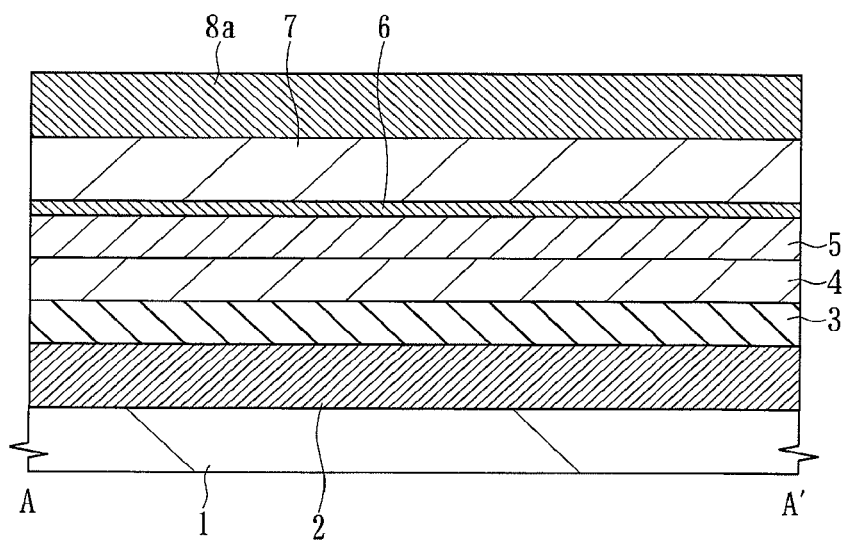
Figure 32:
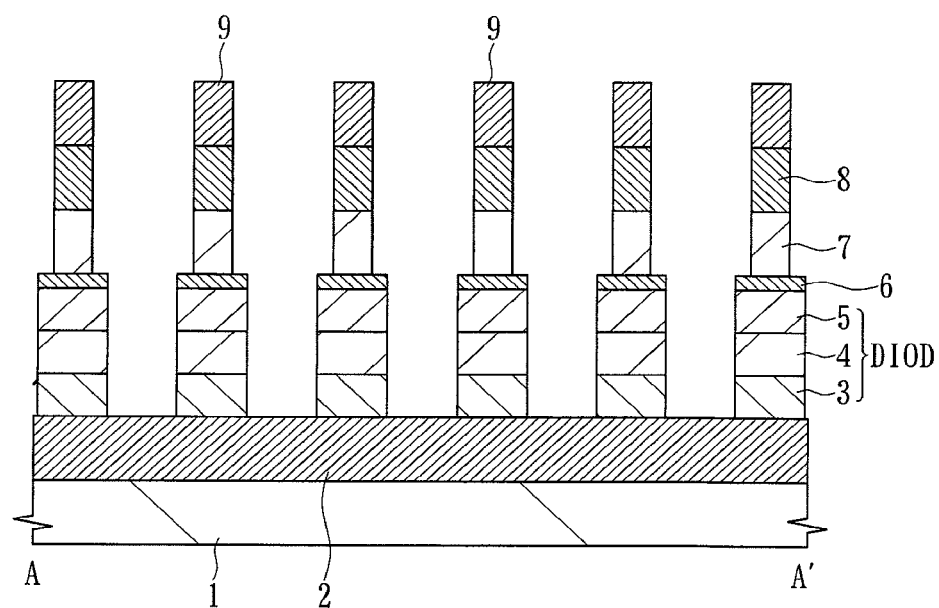
Figure 33:
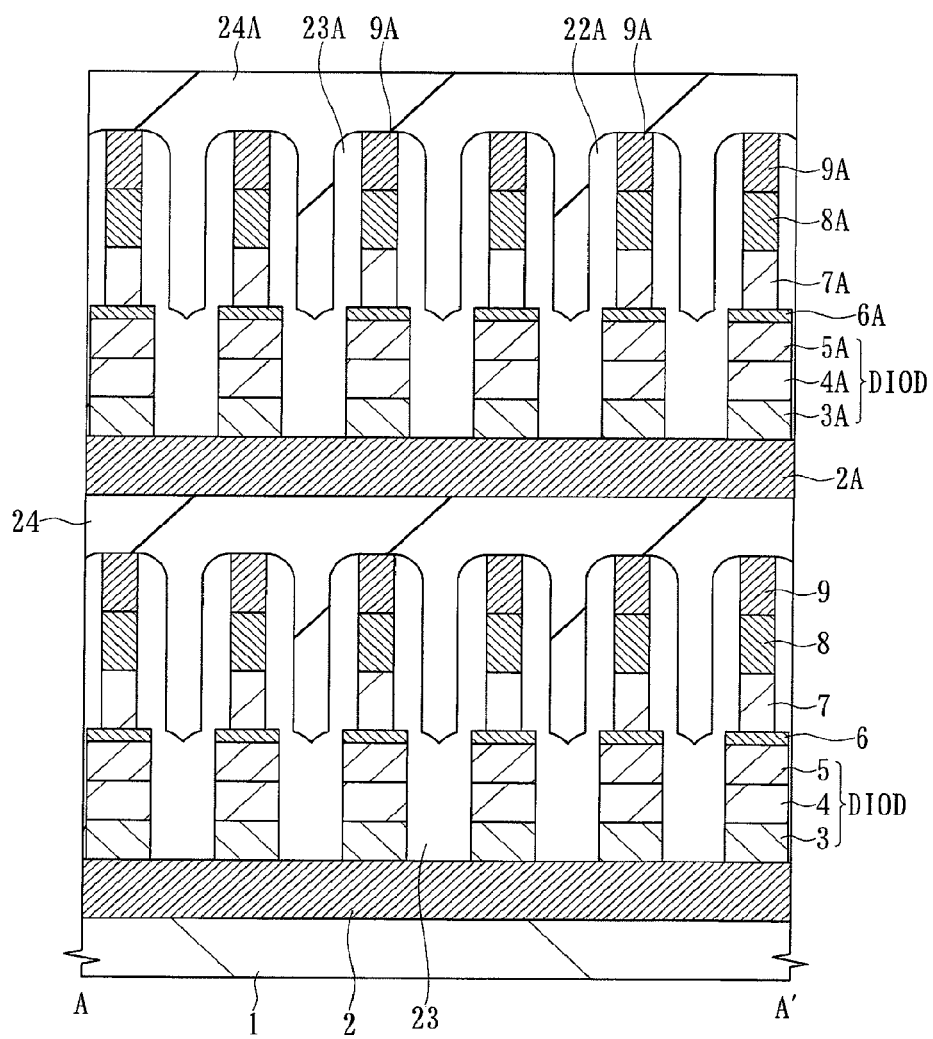
Figure 34:
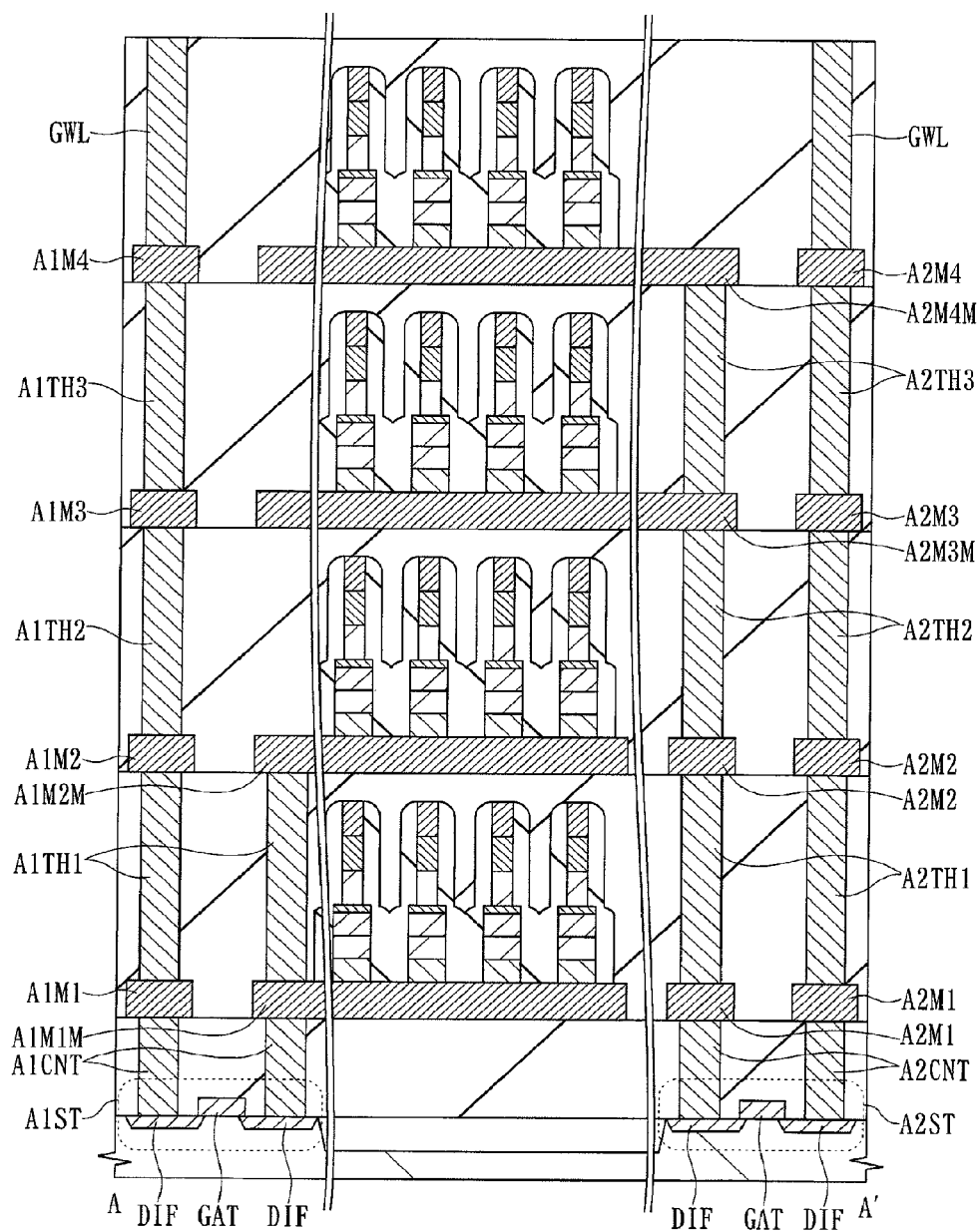
Figure 35:
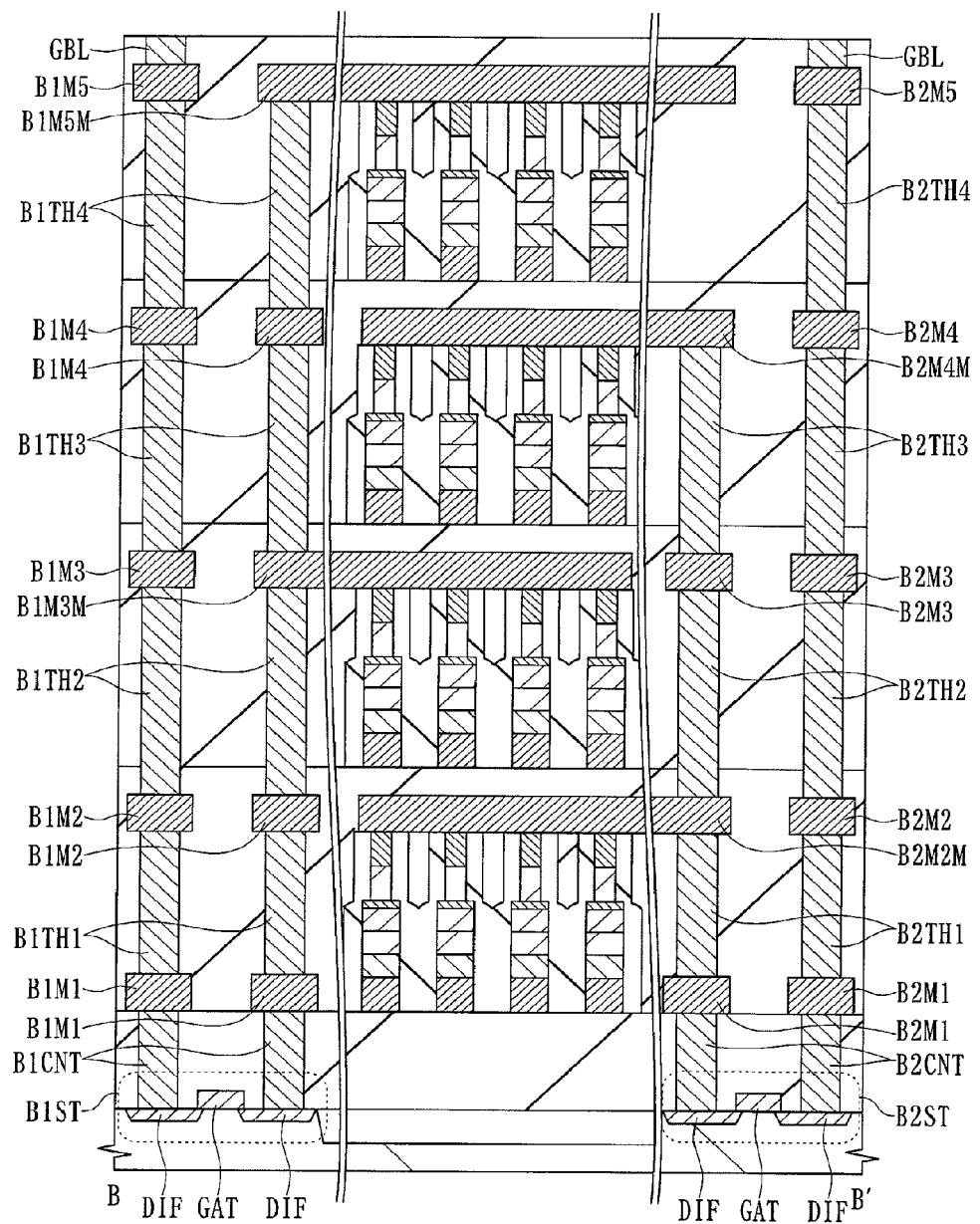
Figure 36:
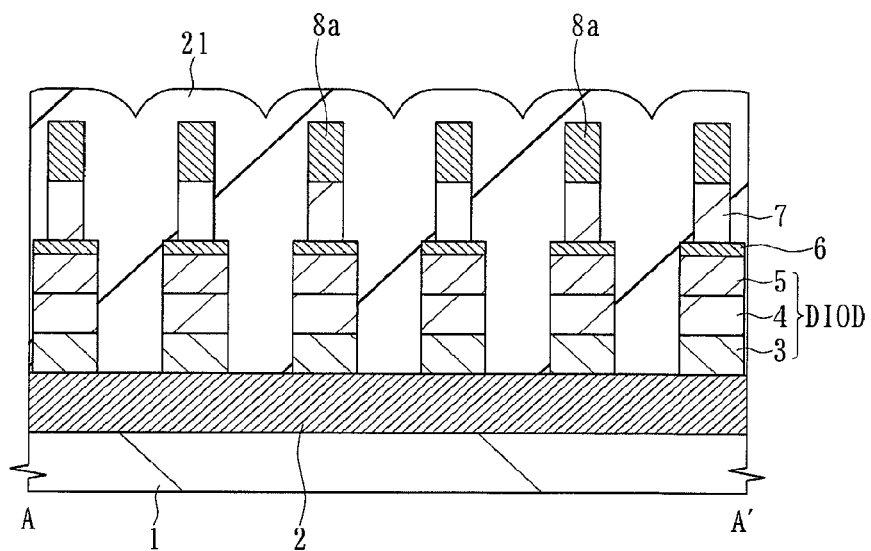
Figure 37:
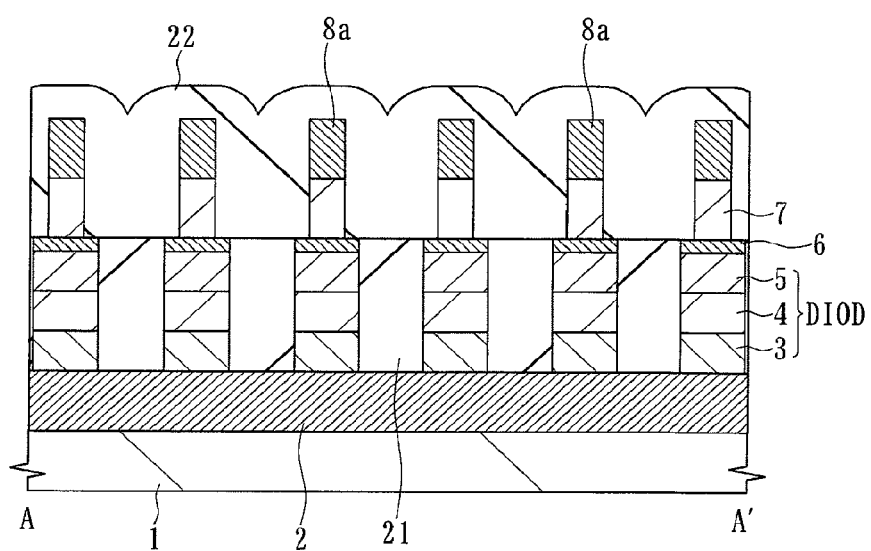
Figure 38:
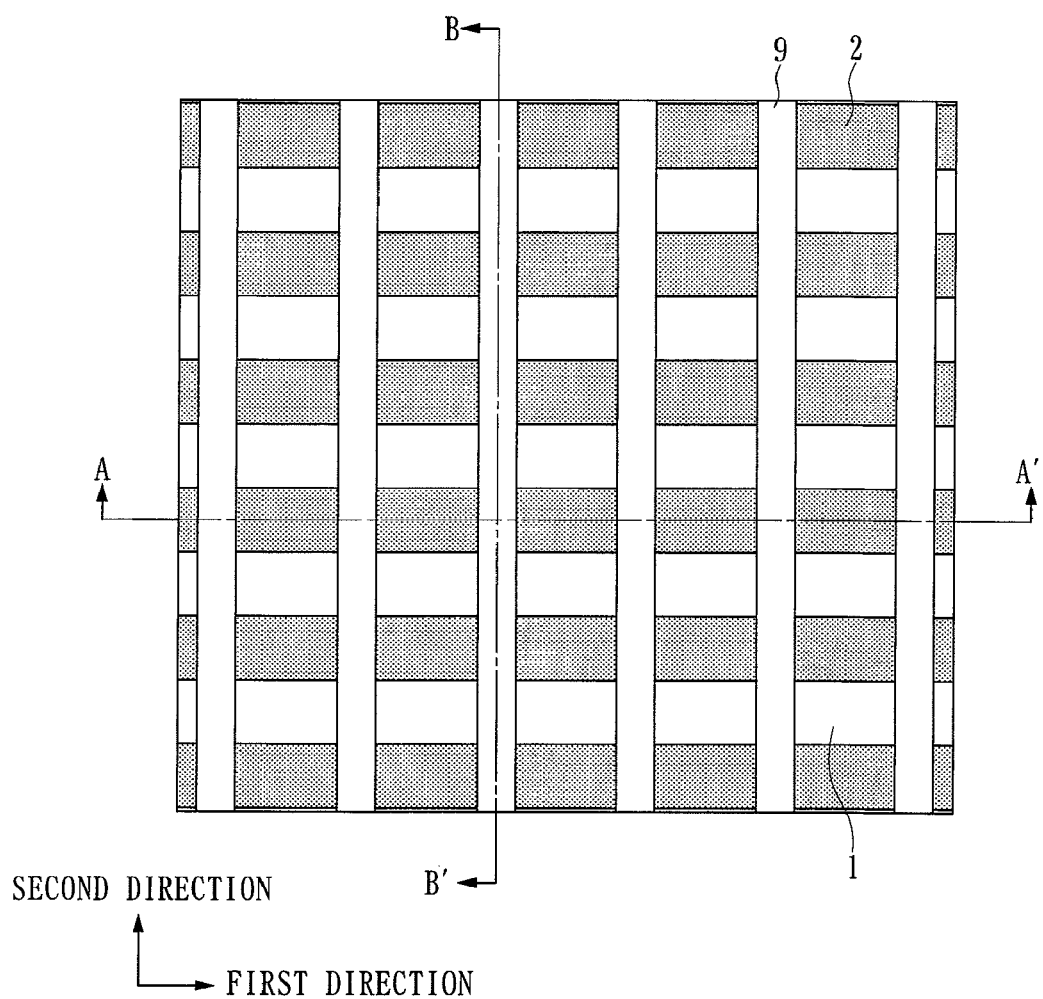
Figure 39:
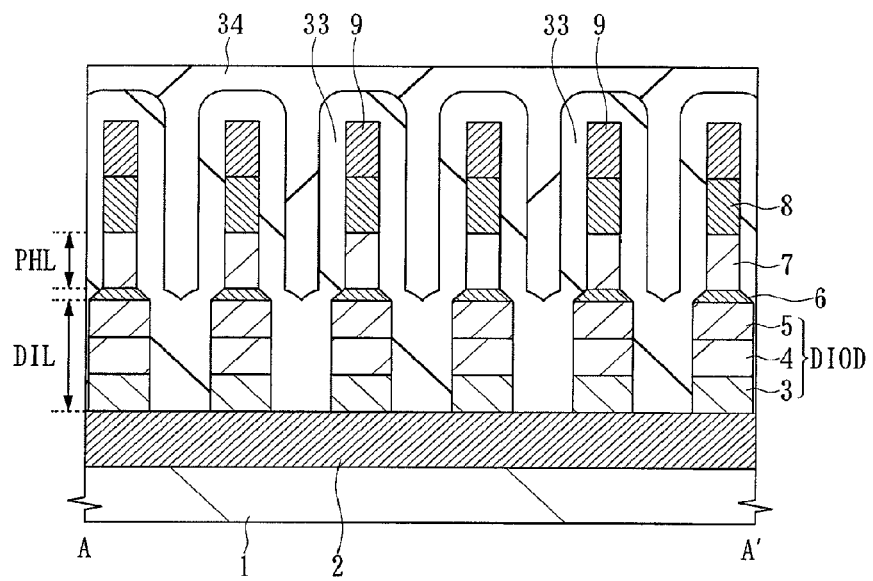
Figure 40:
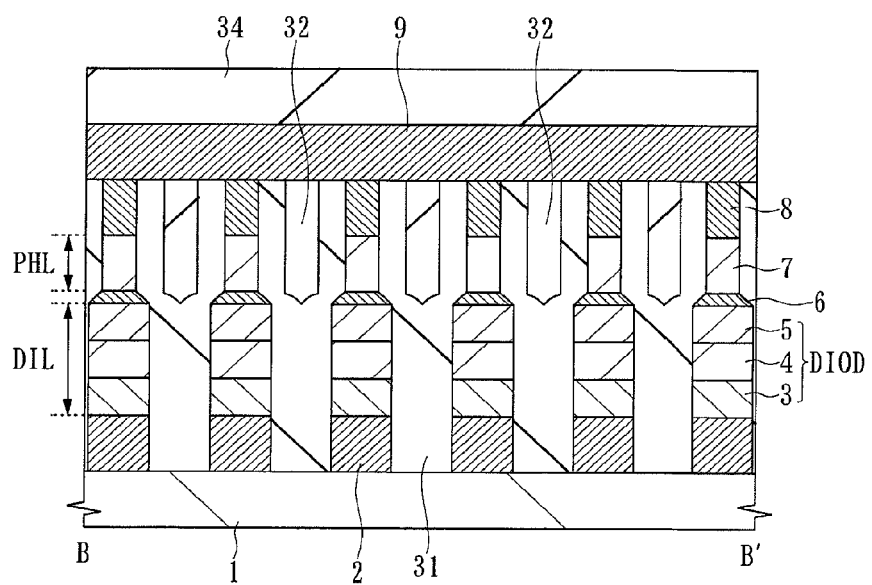
Figure 41:
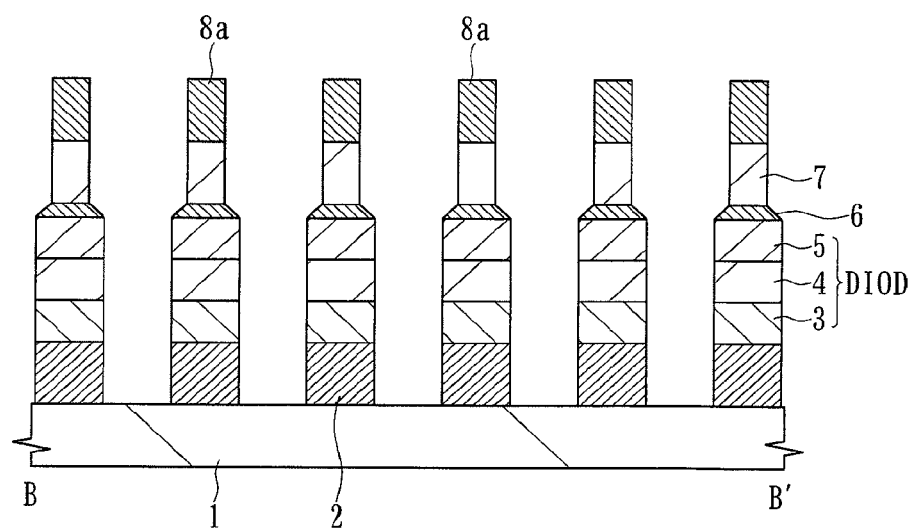
Figure 42:
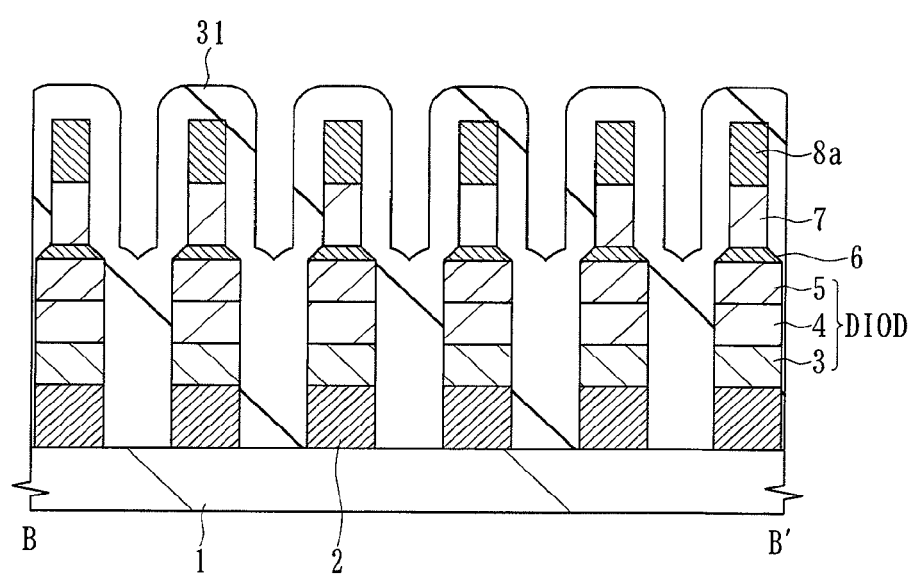
Figure 43:
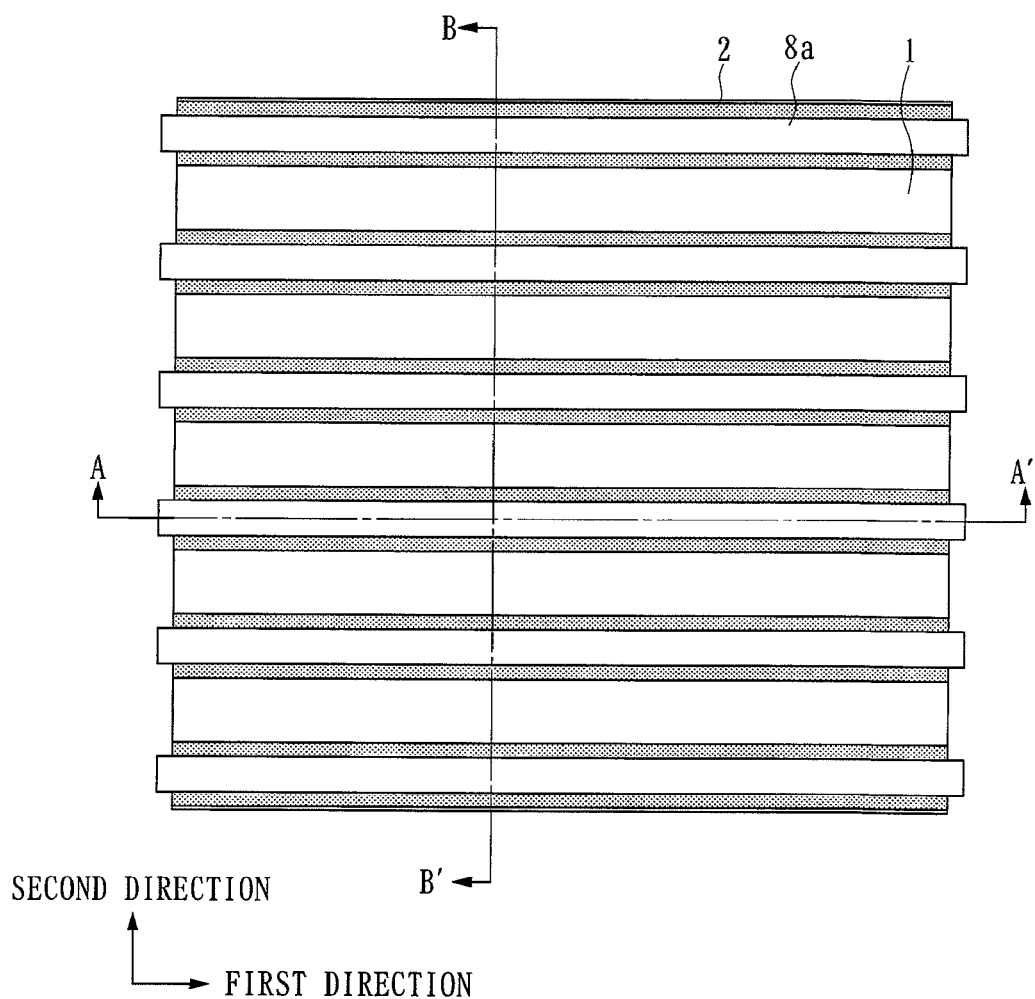
Figure 44:
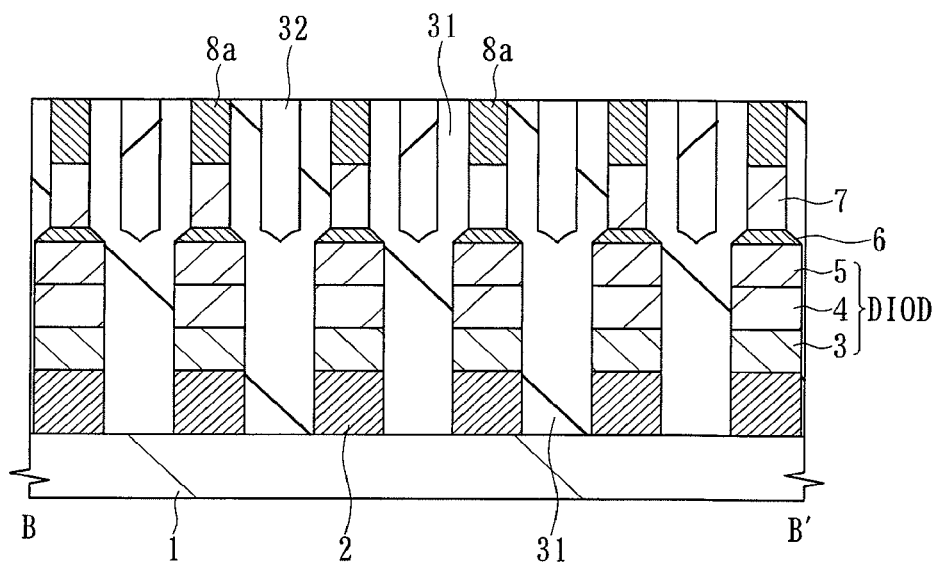
Figure 45:
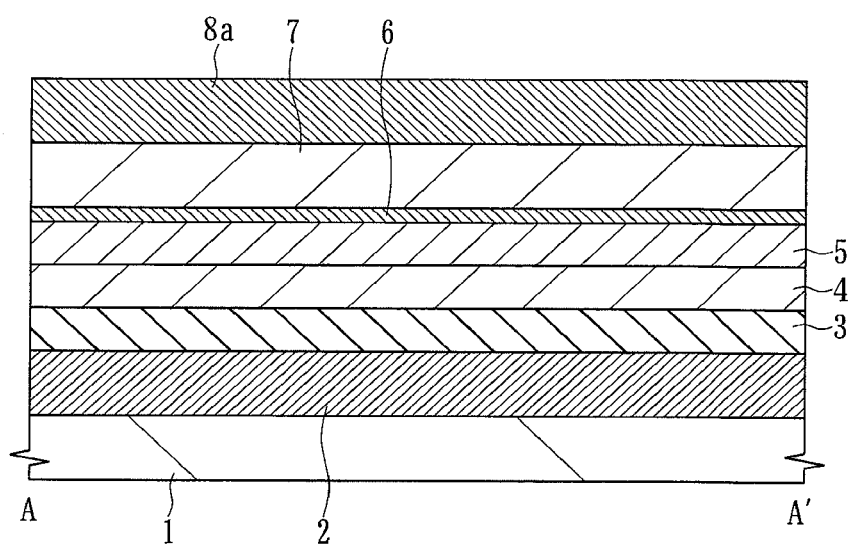
Figure 46:
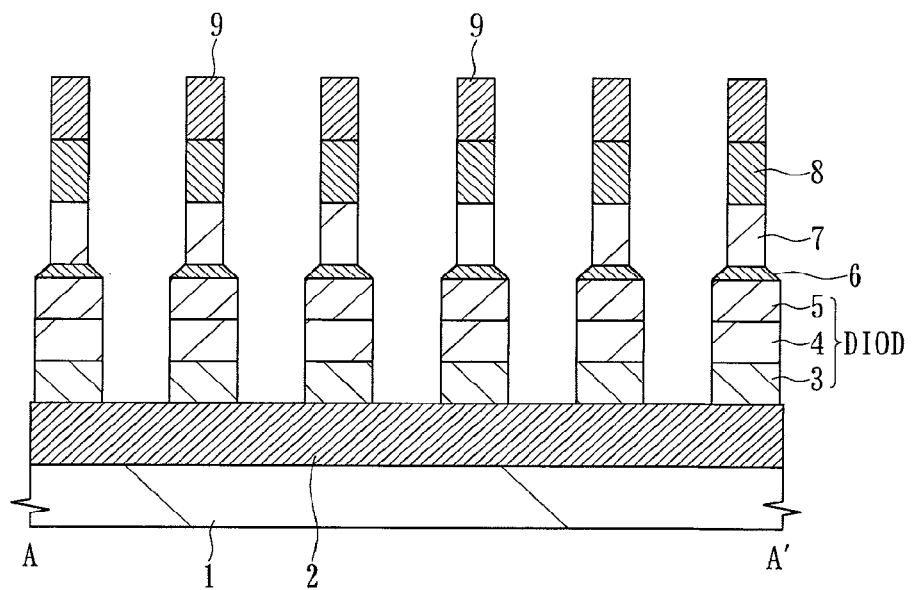
Figure 47:
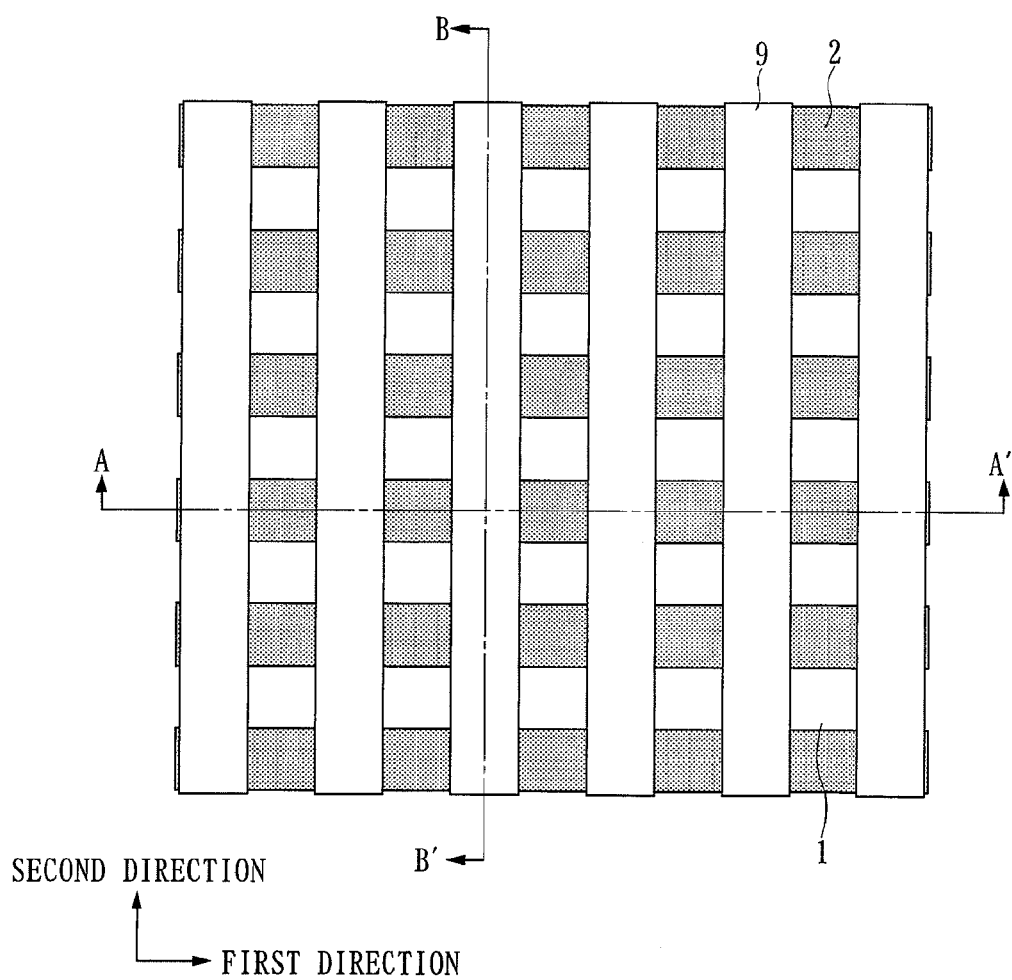
Figure 48:
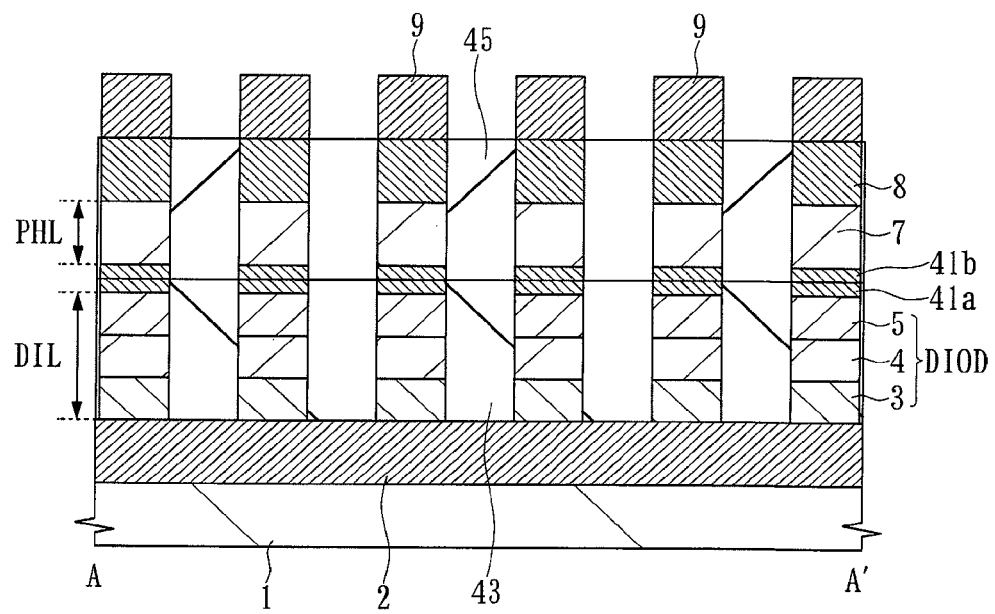
Figure 49:
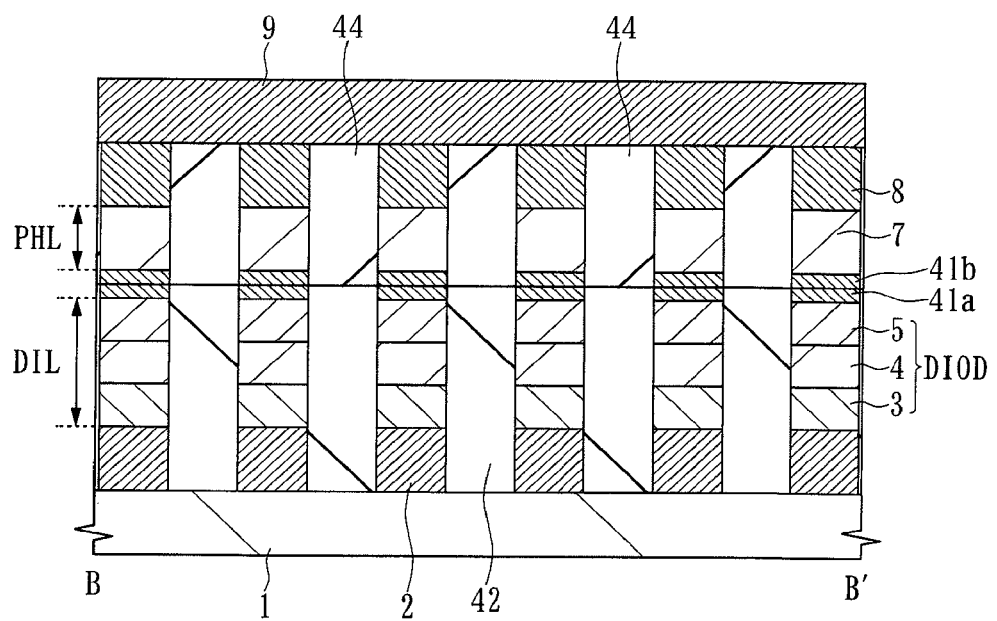
Figure 50:
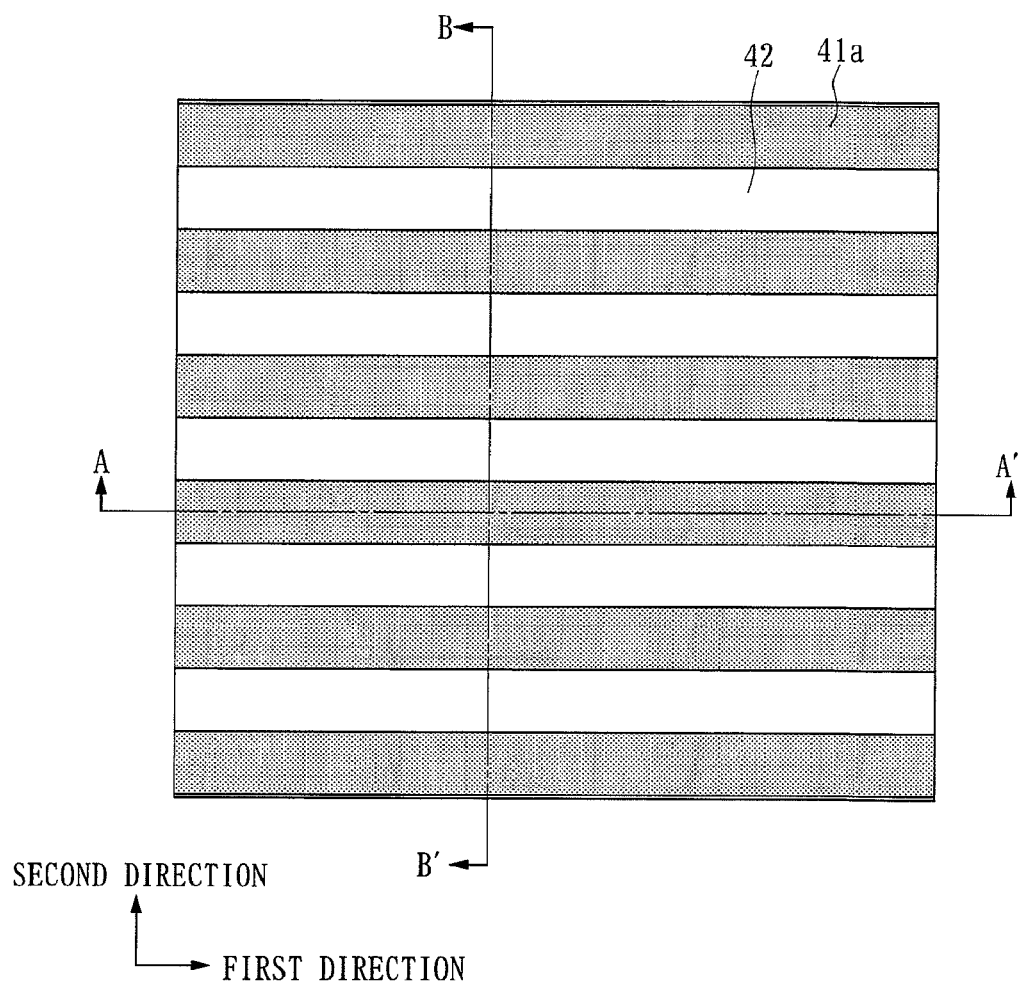
Figure 51:
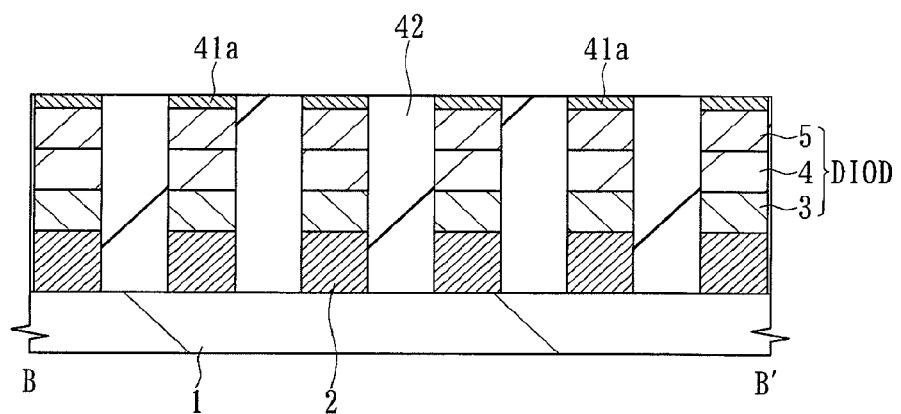
Figure 52:
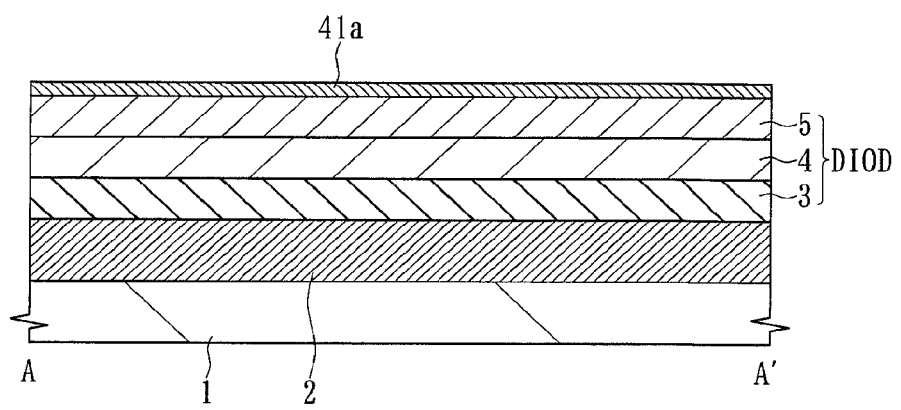
Figure 53:
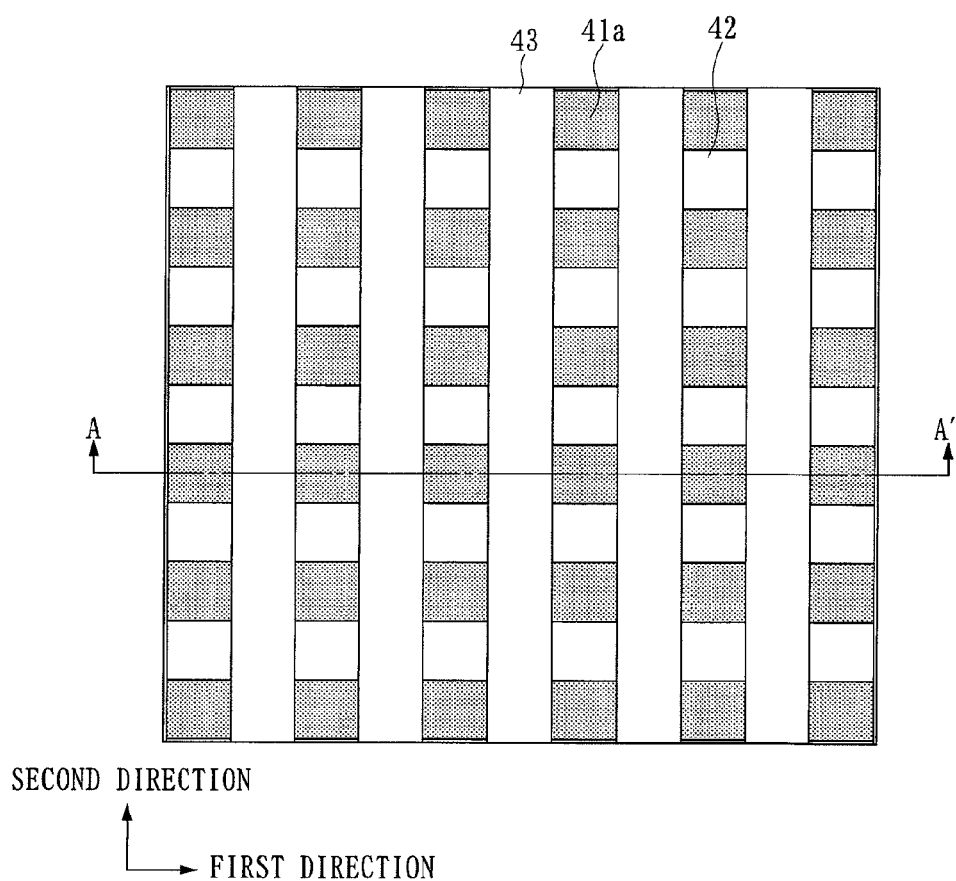
Figure 54:
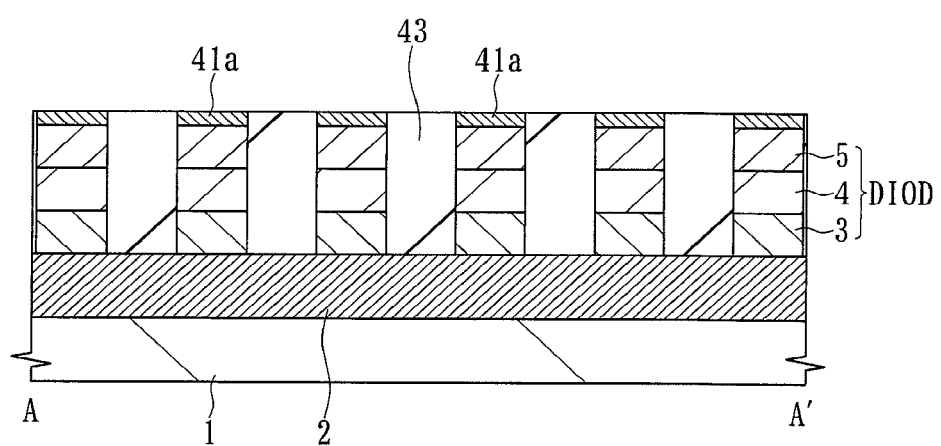
Figure 55:
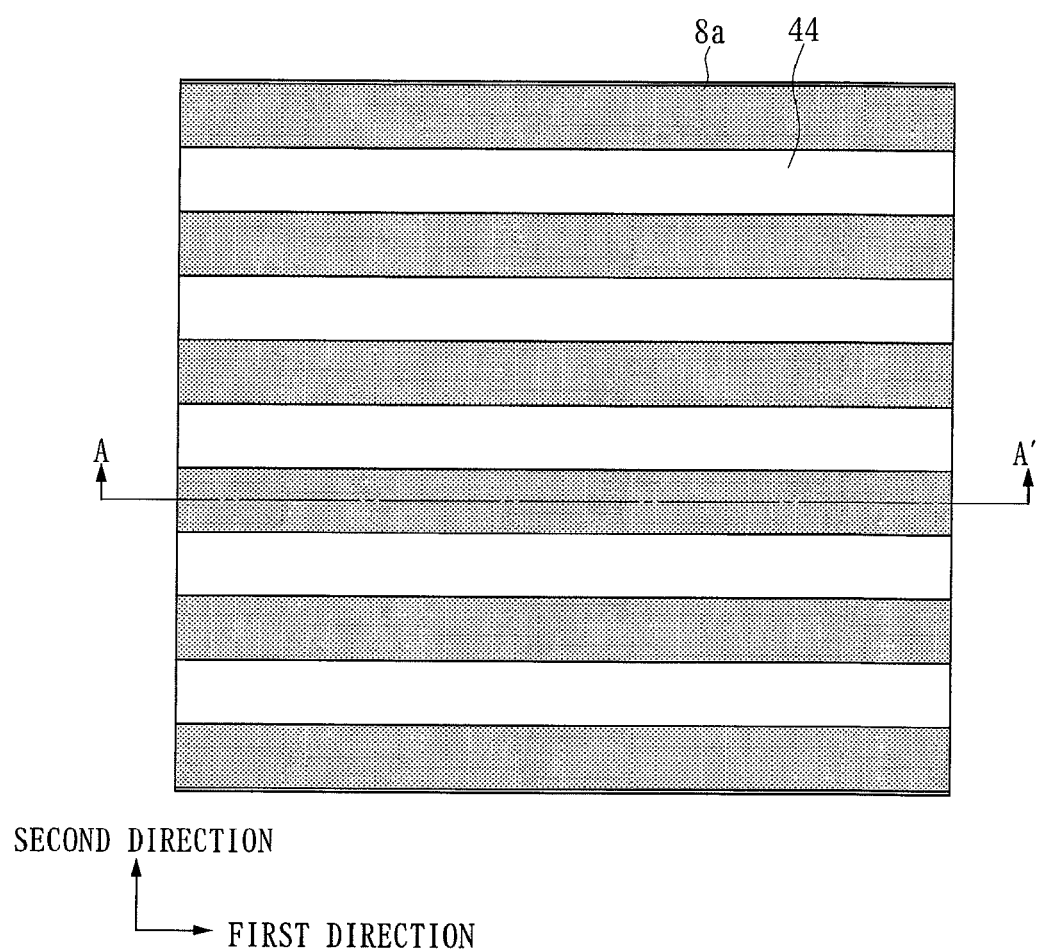
Figure 56:
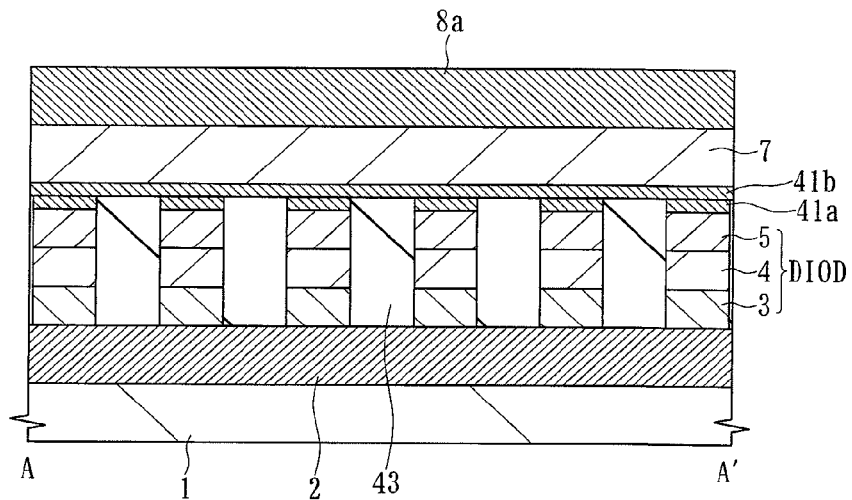
Figure 57:
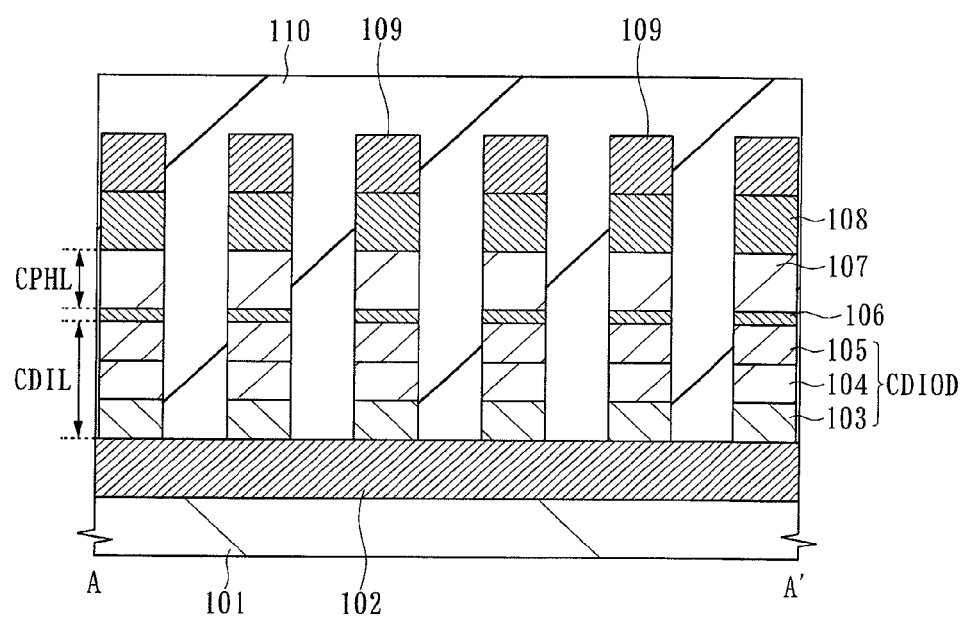

FIG. 21 a cross-sectional view of main parts of the phase-change memory along the word-line pattern in the case where the memory matrix of the first embodiment is stacked into four layers;

FIG. 22 is a cross-sectional view of main parts of the phase-change memory along the bit-line pattern in the case where the memory matrix of the first embodiment is stacked into four layers;

FIG. 23 is a top view of a memory matrix of a phase-change memory according to a second embodiment of the present invention;

FIG. 24 is a cross-sectional view of main parts of the memory matrix taken along the line of FIG. 23;

FIG. 25 is a cross-sectional view of main parts of the memory matrix taken along the line B-B' of FIG. 23;

FIG. 26 is a cross-sectional view (B-B' line) of main parts of the memory matrix showing a manufacturing process of the phase-change memory according to the second embodiment of the present invention;

FIG. 27 is a cross-sectional view (B-B' line) of main parts of the phase-change memory in the manufacturing process continued from FIG. 26;

FIG. 28 is a cross-sectional view (B-B' line) of main parts of the phase-change memory in the manufacturing process continued from FIG. 27;

FIG. 29 is a top view of the phase-change memory in the manufacturing process continued from FIG. 28;

FIG. 30 is a cross-sectional view (B-B' line) of main parts of the phase-change memory in the manufacturing process continued from FIG. 28;

FIG. 31 is a cross-sectional view (A-A' line) of main parts of the phase-change memory in the manufacturing process continued from FIG. 28;

FIG. 32 is a cross-sectional view line) of main parts of the phase-change memory in the manufacturing process continued from FIG. 29, FIG. 30, and FIG. 31;

FIG. 33 is a cross-sectional view of main parts of the phase-change memory in the case where the memory matrix of the second embodiment is stacked into two layers;

FIG. 34 is a cross-sectional view of main parts of the phase-change memory along a word-line pattern in the case where the memory matrix of the first embodiment is stacked into four layers;

FIG. 35 is a cross-sectional view of main parts of the phase-change memory along a bit-line pattern in the case where the memory matrix of the first embodiment is stacked into four layers;

FIG. 36 is a cross-sectional view (A-A' line) of main parts of the memory matrix showing another manufacturing process of the phase-change memory according to second embodiment continued from FIG. 26;

FIG. 37 is a cross-sectional view (A-A' line) of main parts of the phase-change memory in the manufacturing process continued from FIG. 36;

FIG. 38 is a top view of a memory matrix of a phase-change memory according to a third embodiment of the present invention;

FIG. 39 is a cross-sectional view of main parts of the memory matrix taken along the line A-A' of FIG. 38;

FIG. 40 is a cross-sectional view of main parts of the memory matrix taken along the line B-B' of FIG. 38;

FIG. 41 is a cross-sectional view (B-B' line) of main parts of the memory matrix showing a manufacturing process of the phase-change memory of the third embodiment;

FIG. 42 is a cross-sectional view (B-B' line) of main parts of the phase-change memory in the manufacturing process continued from FIG. 41;

FIG. 43 is a top view of the phase-change memory in the manufacturing process continued from FIG. 42;

FIG. 44 is a cross-sectional view (B-B' line) of main parts of the phase-change memory in the manufacturing process continued from FIG. 42;

FIG. 45 is a cross-sectional view (A-A' line) of main parts of the phase-change memory in the manufacturing process continued from FIG. 42;

FIG. 46 is a cross-sectional view (A-A' line) of main parts of the phase-change memory in the manufacturing process continued from FIG. 43, FIG. 44, and FIG. 45;

FIG. 47 is a top view of a memory matrix of a phase-change memory according to a fourth embodiment of the present invention;

FIG. 48 is a cross-sectional view of main parts of the memory matrix taken along the line A-A' of FIG. 47;

FIG. 49 is a cross-sectional view of main parts of the memory matrix taken along the line B-B' of FIG. 47;

FIG. 50 is a top view of the memory matrix showing a manufacturing process of the phase-change memory according to the fourth embodiment;

FIG. 51 is a cross-sectional view of main parts of the memory matrix taken along the line B-B' of FIG. 50;

FIG. 52 is a cross-sectional view of main parts of the memory matrix taken along the line of FIG. 50;

FIG. 53 is a top view of the phase-change memory in the manufacturing process continued from FIG. 50, FIG. 51, and FIG. 52;

FIG. 54 is a cross-sectional view of main parts of the memory matrix taken along the line of FIG. 53;

FIG. 55 is a top view of the phase-change memory in the manufacturing process continued from FIG. 53 and FIG. 54;

FIG. 56 is a cross-sectional view of main parts of the memory matrix taken along the line A-A' of FIG. 55; and FIG. 57 is cross-sectional view of main parts of a memory matrix of a phase-change memory studied by the inventors of the present invention.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, in some drawings used in the embodiments, hatching is used even in a plan view so as to make the drawings easy to see. In the embodiments below, "wafer" is mainly a single crystal Si (silicon) wafer, but not only this, it may be an SOI (Silicon On Insulator) wafer, an insulating film substrate for forming an integrated circuit thereon, etc. A shape of a wafer is not limited to circular or substantially circular, and it includes a square shape, a rectangular shape, etc.

Moreover, components having the same function are denoted by the same reference symbols throughout the drawings for describing the embodiment, and the repetitive description thereof will be omitted. Hereinafter, embodiments of the present invention will be described in detail with reference to the accompanying drawings.

First, a basic structure and a basic operation of a phase-change memory studied by the present inventors will be briefly described since a structure of a phase-change memory according to the embodiments of the present invention may be clearer. In the following descriptions, a phase-change memory cell studied by the present inventors will be conveniently called as a conventional phase-change memory cell.

FIG. 57 illustrates a cross-sectional view of main parts of the conventional phase-change memory. In FIG. 57, 101 denotes a semiconductor substrate and 102 denotes a first metal wiring extending along a first direction. Further, 103 denotes a first polycrystalline silicon film, 104 denotes a second polycrystalline silicon film, 105 denotes a third polycrystalline silicon film, and the three layers form a diode CDIOD that is a selection element. Further, 106 denotes a buffer layer, 107 denotes a phase-change material that is a memory element, 108 denotes a plug-shaped second metal wiring, 109 denotes a third metal wiring extending along a second direction orthogonal to the first direction, and 110 denotes an interlayer film.

In a rewrite operation of the conventional phase-change memory, a current sequentially flows from the third metal wiring 109 through the second metal wiring 108, the phase-change material 107, the buffer layer 106, the diode CDIOD and then to the first metal wiring 102. In the system of them, the Joule heat is generated mainly at a portion having a high resistance, that is, at the phase-change material 107, an interface between the diode DIOD and the buffer 106, or at an interface between the diode DIOD and the first metal wiring 102. The generated heat diffuses into surrounding materials. For example, the heat generated in the phase-change material 107 diffuses into the buffer layer 106, the second metal wiring 108, and the interlayer 110 present around the phase-change material 107.

First Embodiment

Figure 1:
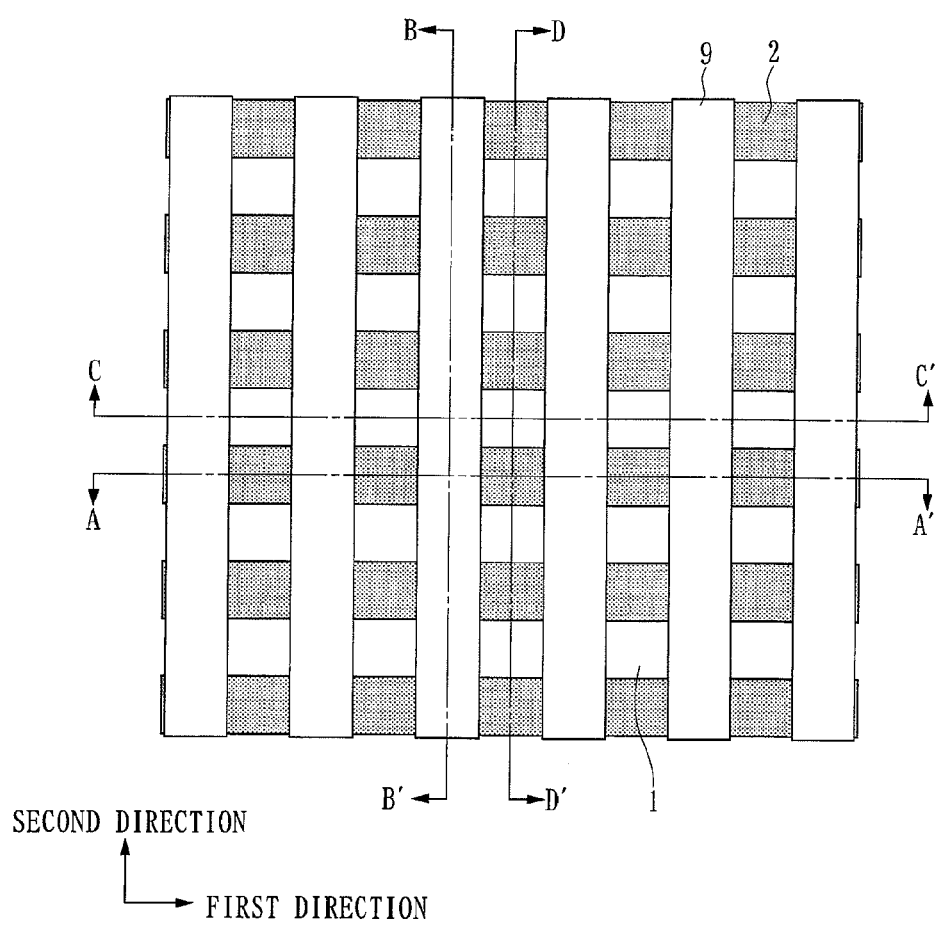
FIG. 1 is a top view of a memory matrix of a phase-change memory according to a first embodiment of the present invention.
Figure 2:
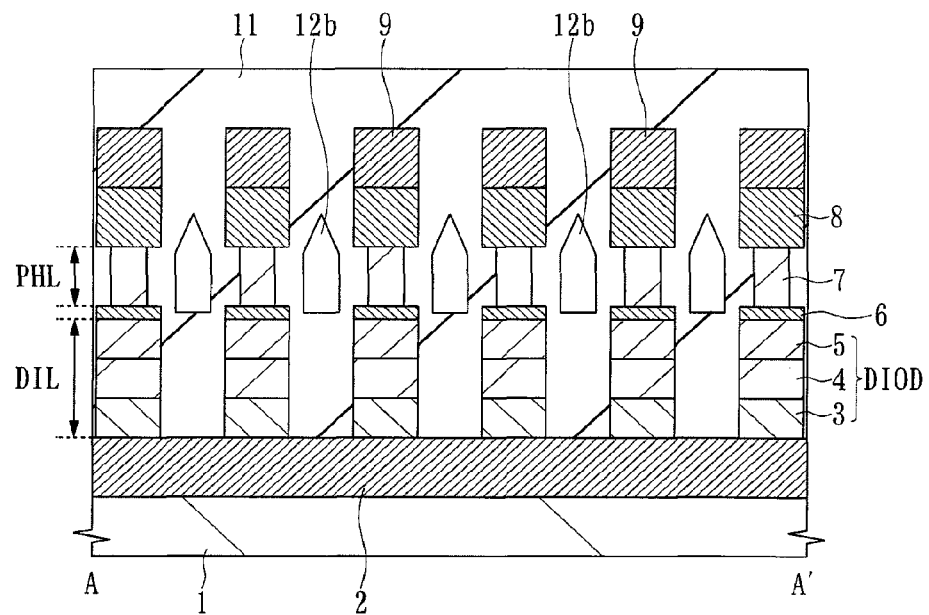
FIG. 2 is a cross-sectional view of main parts of the memory matrix taken along the line of FIG. 1.
Figure 3:
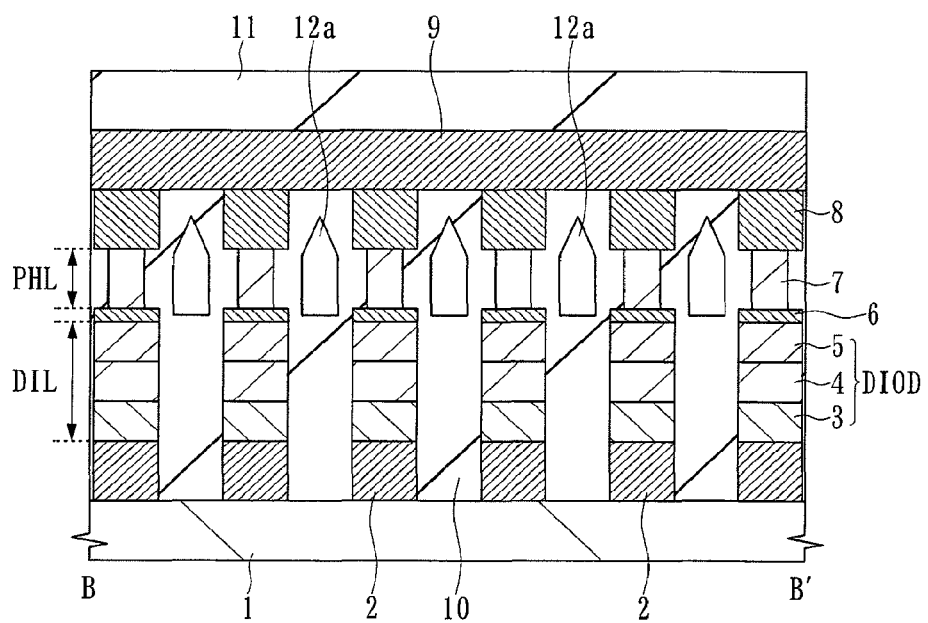
FIG. 3 is a cross-sectional view of main parts of the memory matrix taken along the line B-B' of FIG. 1.
Figure 4:
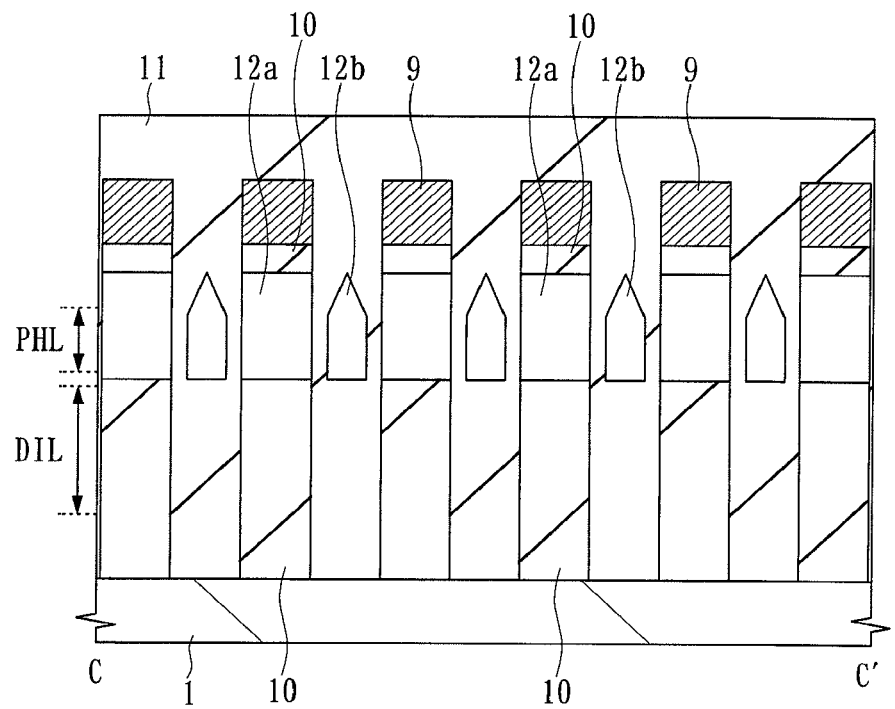
FIG. 4 is a cross-sectional view of main parts of the memory matrix taken along the line C-C' of FIG. 1.
Figure 5:
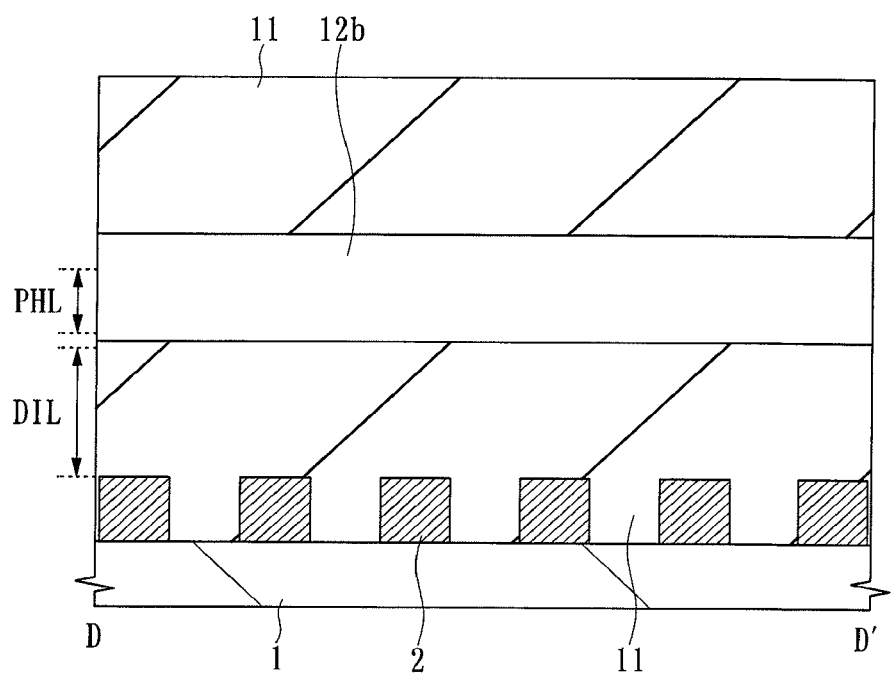
FIG. 5 is a cross-sectional view of main parts of the memory matrix taken along the line D-D' of FIG. 1.

A memory matrix of a phase-change memory according to a first embodiment will be described with reference to FIG. 1 to FIG. 5. FIG. 1 is a top view of the memory matrix, FIG. 2 is a cross-sectional view of main parts of the memory matrix taken along the line A-A' of FIG. 1, FIG. 3 is a cross-sectional view of main parts of the memory matrix taken along the line B-B' of FIG. 1, FIG. 4 is a cross-sectional view of main parts of the memory matrix taken along the line C-C' of FIG. 1, and FIG. 5 is a cross-sectional view of main parts of the memory matrix taken along the line D-D' of FIG. 1. In FIG. 1, only a third metal wiring, a first metal wiring and a semiconductor substrate are illustrated for facilitating understanding of the structure of the memory matrix.

In the figures, reference numeral 1 denotes a semiconductor substrate and reference numeral 2 denotes a first metal wiring extending along a first direction. Further, reference numeral 3 denotes a first polycrystalline silicon film, reference numeral 4 denotes a second polycrystalline silicon film, reference numeral 5 denotes a third polycrystalline silicon film, and the three layers form a diode DIOD that is a selection element. Furthermore, reference numeral 6 denotes a buffer layer (e.g., TiN), reference numeral denotes a phase-change material that is a memory element (such as $Ge_2Sb_2Te_5$), reference numeral 8 denotes a second metal wiring (e.g., TiN), reference numeral 9 denotes a third metal wiring, reference numeral 10 denotes a first interlayer film (e.g., TEOS: tetraethoxysilane), reference numeral 11 denotes a second interlayer film (e.g., TEOS), and reference numerals 12a and 12b denote a void. The first interlayer film 10 and the second interlayer film 11 are formed in different regions from each other, which electrically isolate the diode DIOD and phase-change material etc. adjacent to each other.

In a rewrite operation of the phase-change memory, similarly to a current path of the conventional phase-change memory described above, a current sequentially flows from the third metal wiring 9 through the second metal wiring 8, the phase-change material 7, the buffer layer 6, and the diode DIOD to the first metal wiring 2.

In the conventional phase-change memory, a thermal conductivity $K_{CP}$ between the memory cells in a layer CPHL in which the phase-change material 107 is provided is equal to a thermal conductivity $K_{CD}$ between the memory cells in a layer CDIL in which the diode CDIOD is provided. In the phase-change memory according to the first embodiment, the first interlayer film 10 or the second interlayer film 11 is present between the adjacent memory cells in a layer DIL in which the diode DIOD is provided, and the first interlayer film 10 and the voids 12a, or the second interlayer film 11 and the voids 12b are present between the adjacent memory cells in a layer PHL in which the phase-change material 7 is provided. Here, a thermal conductivity of the first interlayer film 10 and the second interlayer film 11 is $K_I$ (thermal conductivity of TEOS: about 1.4 W/(m·K)), and a thermal conductivity of the voids 12a and 12b is $K_A$ (thermal conductivity of vacuum: about 0 W/(cm·K)), having a relationship of $K_A < K_I$.

Thus, a thermal conductivity $K_P$ between the memory cells in the layer PHL in which the phase-change material 7 is provided is smaller than a thermal conductivity $K_D$ between the memory cells in the layer DIL in which the diode DIOD is provided.

Therefore, in the phase-change memory according to the first embodiment, heat dissipation is larger in the diode portion and heat dissipation is smaller in the phase-change material portion as compared with the conventional phase-change memory. In other words, the memory matrix according to the first embodiment is configured such that the diode DIOD is less likely to be at a high temperature and the phase-change material 7 is likely to at a high temperature.

Figure 6:
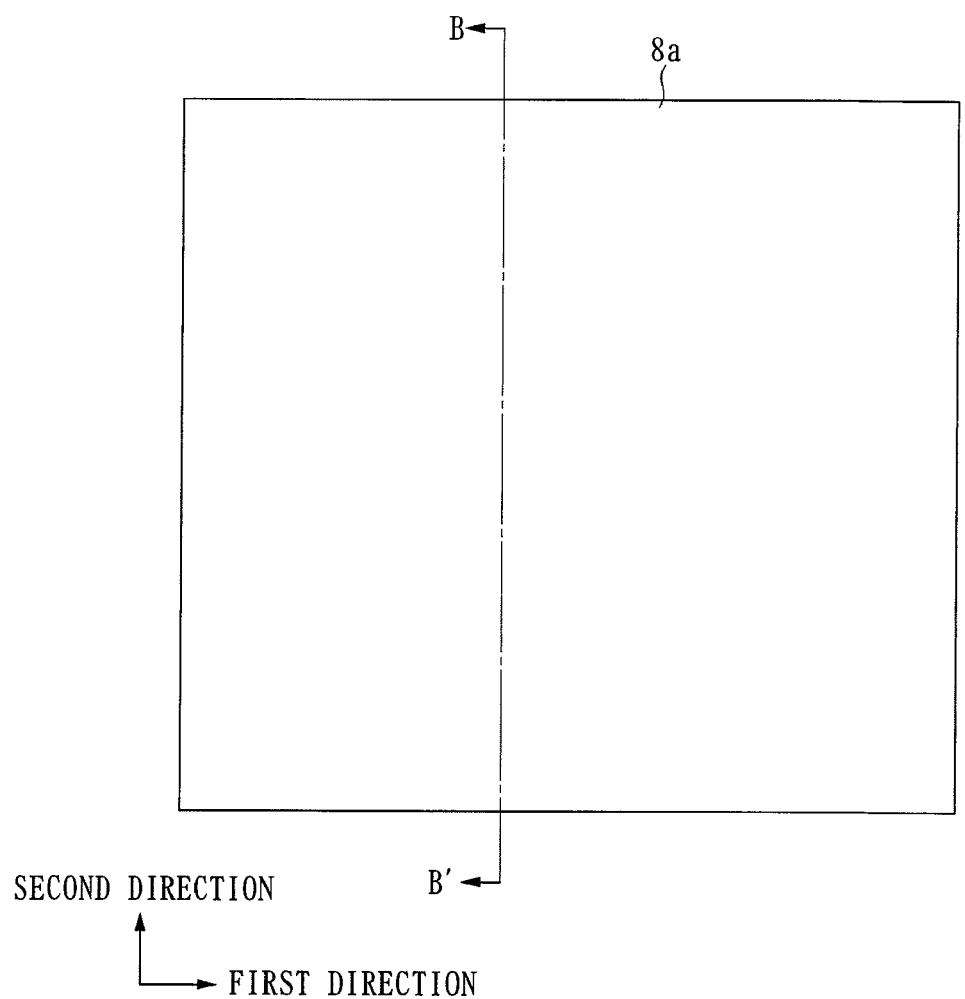
FIG. 6 is a top view of the memory matrix showing a manufacturing process of the phase-change memory according to the first embodiment of the present invention.

Next, a method of manufacturing the phase-change memory according to the first embodiment will be described with reference to FIGS. 6 to 16. FIGS. 6 and 12 are top views of the memory matrix, FIGS. 7 to 11 and FIG. 13 are cross-sectional views of main parts of the memory matrix corresponding to the line B-B' of FIG. 1, and FIGS. 14 to 16 are cross-sectional views of main parts of the memory matrix corresponding to the line A-A' of FIG. 1.

Figure 7:
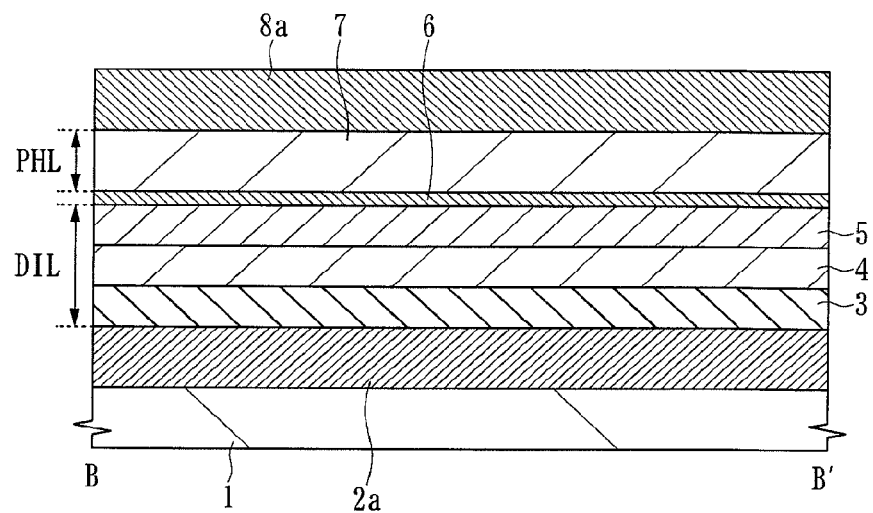
FIG. 7 is a cross-sectional view of main parts of the memory matrix corresponding to the line B-B' of FIG. 1.

At first, as shown in FIGS. 6 and 7, a first metal film 2a, the first polycrystalline silicon film 3, the second polycrystalline silicon film 4, the third polycrystalline silicon film 5, the buffer layer 6, the phase-change material 7, and a second metal film 8a are sequentially deposited on the semiconductor substrate 1.

A material of the first metal film 2a is formed of W (tungsten) for example, and it can be formed by a CVD (Chemical Vapor Deposition) method or the like for example. When the first polycrystalline silicon film 3 is formed of polycrystalline silicon containing B (boron) as an impurity, since the first polycrystalline silicon film 3 and the first metal film 2a are configured to be directly joined, it is desirable to lower a contact resistance between the first polycrystalline silicon film 3 and the first metal film 2a with setting the material of the first metal film 2a as W. A film thickness of the first metal film 2a is desirably in a range of 10 to 100 nm, for example. When the film thickness of the first metal film 2a is too thin, a wiring resistance becomes high, and when it is too thick, the processing shape becomes difficult to control.

A material of the first polycrystalline silicon film 3 is polycrystalline silicon containing any of B, Ga (gallium) or In (indium) as an impurity, a material of the second polycrystalline silicon film 4 is intrinsic polycrystalline silicon, and a material of the third polycrystalline silicon film 5 is polycrystalline silicon containing P (phosphorous) or As (arsenic) as an impurity. They can be formed by, for example, a CVD method, respectively. A total film thickness of the first polycrystalline silicon film 3, the second polycrystalline silicon film 4 and the third polycrystalline silicon film 5 is desirably in a range of 30 to 250 nm, for example.

The first polycrystalline silicon film 3, the second polycrystalline silicon film 4 and the third polycrystalline silicon film 5 may be crystallized to be formed by laser annealing after being formed as amorphous silicon instead of being formed as polycrystalline silicon from the beginning. Thus, it is possible to reduce a thermal load during the process. While the PIN diode has been exemplified as the selection element, $P^+/N^-/N^+$ diode may be used, by which the same performance as the PIN diode can be accomplished. Tungsten silicide or titanium silicide may be formed by using a silicidation technique on the first polycrystalline silicon film 3 and the first metal film 2a in order to reduce the contact resistance. Similarly, titanium silicide or the like may be formed between the third polycrystalline silicon film 5 and the buffer layer 6.

A material of the buffer layer 6 is TiN for example, and it can be formed by a CVD method or the like for example. The buffer layer 6 is provided in order to prevent the first polycrystalline silicon film 3, the second polycrystalline silicon film 4, the third polycrystalline silicon film 5 and the phase-change material 7 from interdiffusion, and a film thickness of the buffer layer 6 is desirably 50 nm or less since a driving voltage of the phase-change memory increases if the thickness is too large.

The phase-change material 7 is $Ge_2Sb_2Te_5$ for example, and it can be formed by a sputtering method or the like for example. The phase-change material 7 may use a material containing at least one element from among chalcogen elements (S, Se, Te), and can obtain the same performance as $Ge_2Sb_2Te_5$ according to the selection of the composition. A film thickness of the phase-change material 7 is desirably in a range of 5 to 300 nm, for example.

A material of the second metal film 8a is TiN for example, and it can be formed by a CVD method or the like for example. A film thickness of the second metal film 8a is desirably in a range of 10 to 100 nm, for example. When the film thickness of the second metal film 8a is too small, a grinding margin will be deficient in a later CMP (Chemical Mechanical Polishing) step, while when it is too large, the driving voltage of the phase-change memory increases. Further, the material of the buffer layer 6 and the second metal wiring 8a is desirably a material having a low thermal conductivity. When a material having a low thermal conductivity is used, the driving voltage of the phase-change memory can be reduced.

Figure 8:
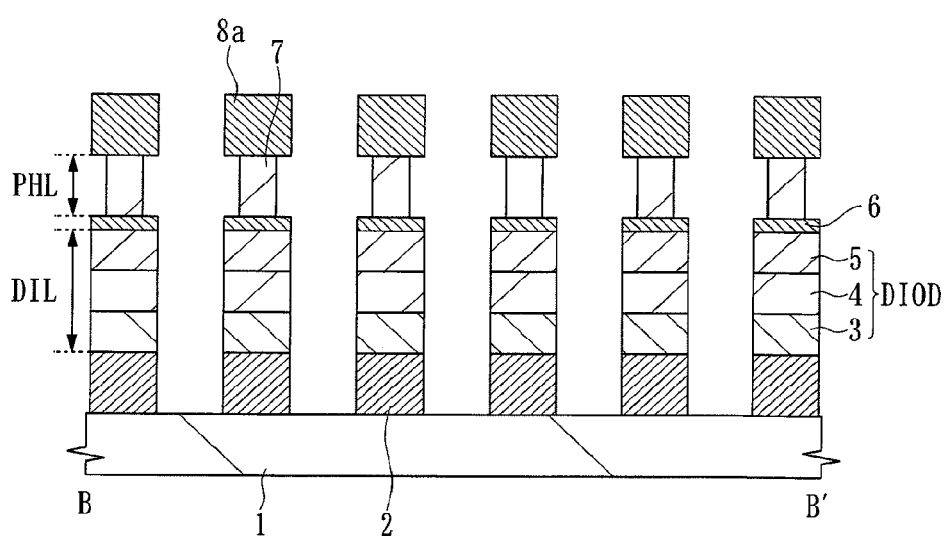
FIG. 8 is a cross-sectional view (B-B' line) of main parts of the phase-change memory in the manufacturing process continued from FIG. 6 and FIG. 7.

Next, as shown in FIG. 8, a lithography technique and a dry etching technique are used to sequentially process the second metal film 8a, the phase-change material 7, the buffer layer 6, the third polycrystalline silicon film 5, the second polycrystalline silicon film 4, the first polycrystalline silicon film 3, and the first metal film 2a, along the first direction. Thus, the first metal wiring 2 formed of the first metal film 2a is formed. A stacked pattern formed of the second metal film 8a, the phase-change material 7, the buffer layer 6, the third polycrystalline silicon film 5, the second polycrystalline silicon film 4, the first polycrystalline silicon film 3, and the first metal wiring 2 is a pattern of a word line, and is formed into a stripe shape along the first direction in parallel with an adjacent pattern. Further, the first metal wiring 2 is electrically connected to the semiconductor substrate 1 including a peripheral circuit such that a read operation and a write operation of the phase-change memory can be performed (illustration is omitted).

It is preferred that a width of the phase-change material 7 is narrower than the widths of the lower buffer layer 6, the third polycrystalline silicon film 5, the second polycrystalline silicon film 4 and the first polycrystalline silicon film 3, and a width of the second metal film 2a is wider than the width of the phase-change material 7. This is for easily forming a void described later. Further, since the smaller a volume of the phase-change material 7 is, the more the drive voltage in a rewrite operation of the phase-change material 7 can be reduced, it is preferred to reduce the volume of the phase-change material 7.

Regarding a method for making the width of the phase-change material 7 narrower than other portions, there is a method in which the second metal film 8a is first processed by an anisotropic dry etching, and the phase-change material 7 is subsequently processed by an isotropic dry etching, and then the buffer layer 6, the third polycrystalline silicon film 5, the second polycrystalline silicon film 4, the first polycrystalline silicon film 3 and the first metal film 2a are sequentially processed by an anisotropic dry etching.

Figure 9:
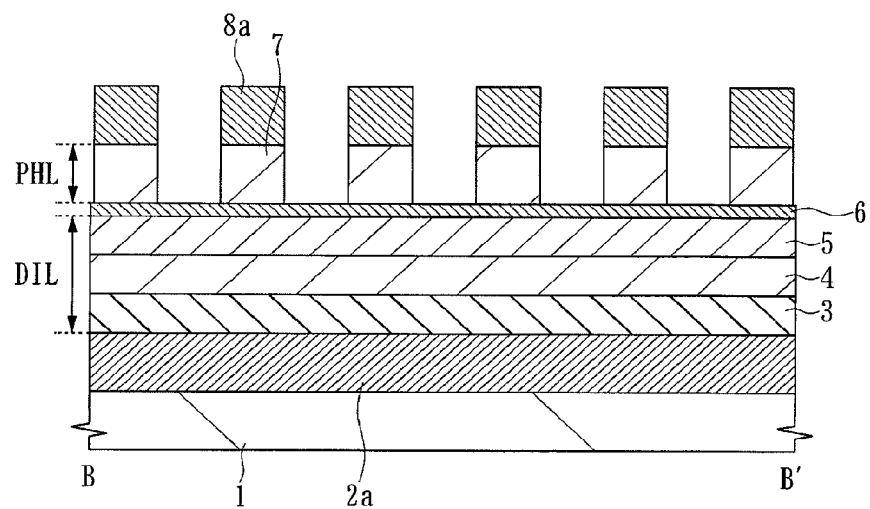
FIG. 9 is a cross-sectional view (B-B' line) of main parts of the phase-change memory in another manufacturing process continued from FIG. 6 and FIG. 7.

As shown in FIG. 9, there is a method in which the second metal film 8a and the phase-change material 7 are first sequentially processed by anisotropic dry etching, and subsequently the phase-change material 7 is processed by isotropic dry etching to apply side etching on a side surface of the phase-change material 7. Then, the buffer layer 6, the third polycrystalline silicon film 5, the second polycrystalline silicon film 4, the first polycrystalline silicon film 3, and the first metal film 2a are sequentially processed again by anisotropic dry etching.

Figure 10:
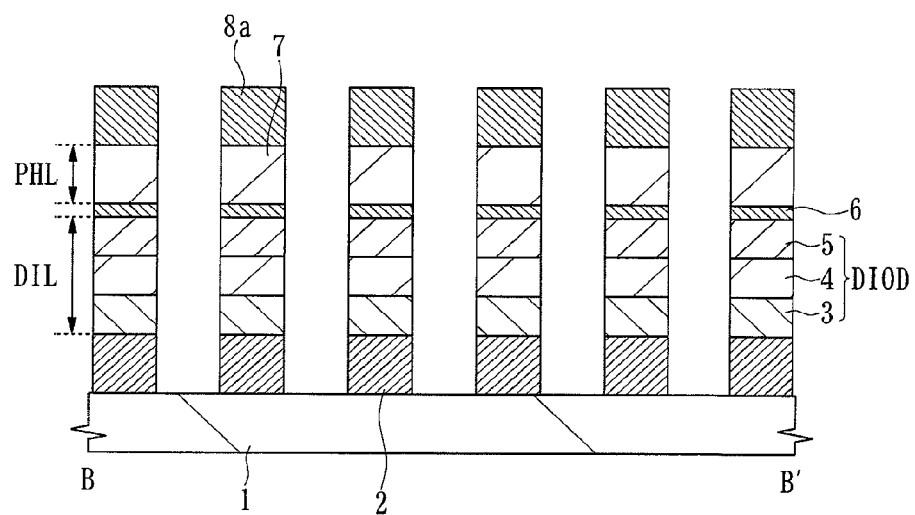
FIG. 10 is a cross-sectional view (B-B' line) of main parts of the phase-change memory in still another manufacturing process continued from FIG. 6 and FIG. 7.

As shown in FIG. 10, there is a method in which the second metal film 8a, the phase-change material 7, the buffer layer 6, the third polycrystalline silicon film 5, the second polycrystalline silicon film 4, the first polycrystalline silicon film 3, and the first metal film 2a are first sequentially processed by anisotropic dry etching and then side etching is selectively applied on the side surface of the phase-change material 7.

Figure 11:
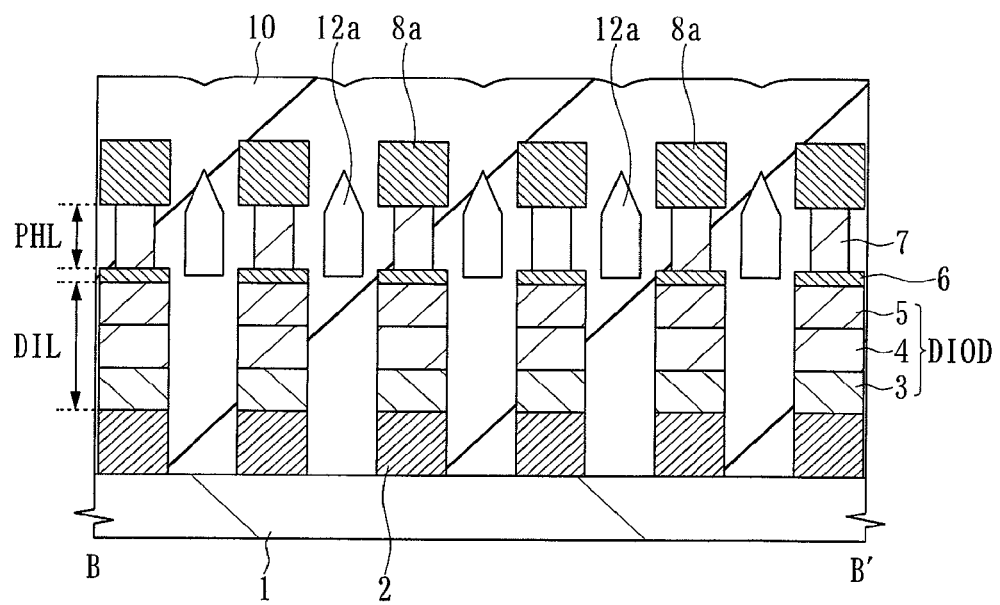
FIG. 11 is a cross-sectional view (B-B' line) of main parts of the phase-change memory in the manufacturing process continued from FIG. 8.
Figure 12:
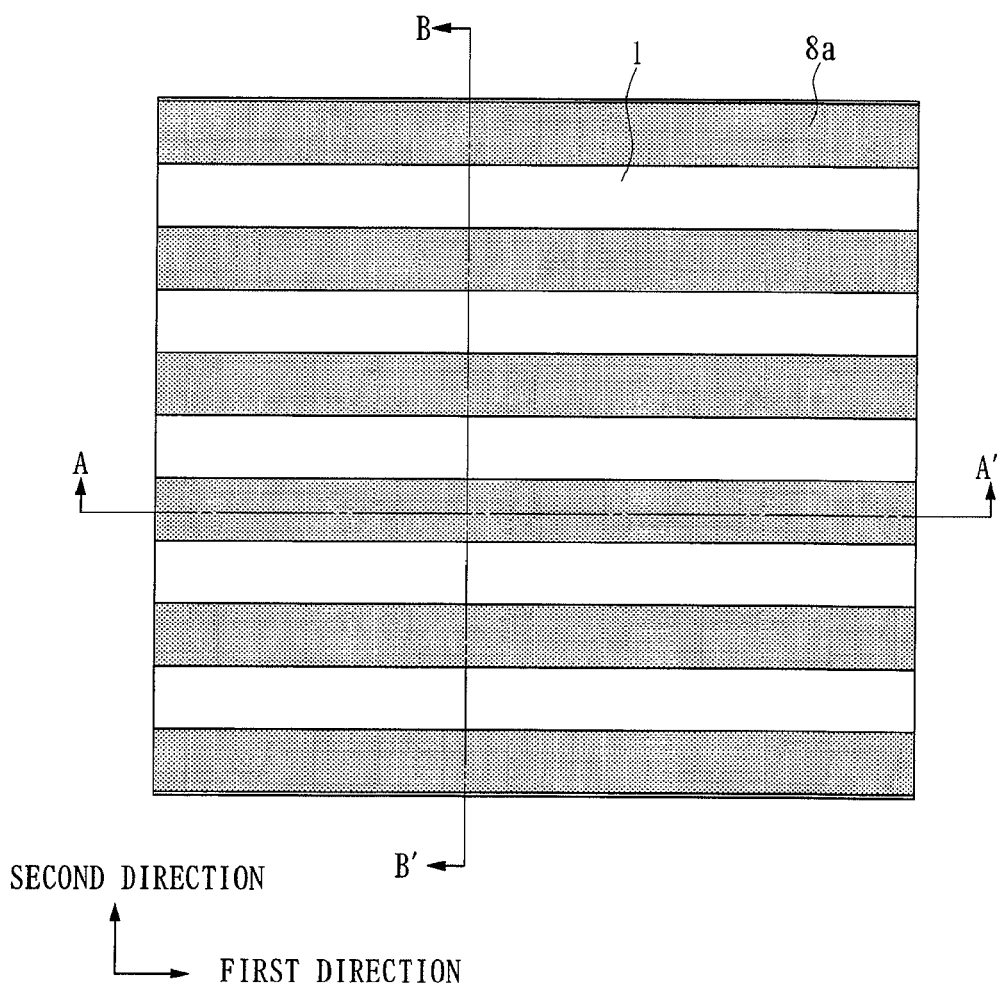
FIG. 12 is a top view of the phase-change memory in the manufacturing process continued from FIG. 11.

Next, as shown in FIG. 11, the first interlayer film 10 is formed on the semiconductor substrate 1. A material of the first interlayer film 10 is TEOS for example, and can be formed by a CVD method and the like for example. Since a width of the phase-change material 7 is narrower than that of the third polycrystalline silicon film 5, the second polycrystalline silicon film 4 and the first polycrystalline silicon film 3 and a width of the second metal film 8a is wider than the width of the phase-change material 7, the first interlayer film 10 is formed by using conditions under which the film formation is isotropically performed so that the voids 12a are simultaneously formed between the adjacent stacked patterns of the second metal film 8a, the phase-change material 7, the buffer layer 6, the third polycrystalline silicon film 5, the second polycrystalline silicon film 4, the first polycrystalline silicon film 3, and the first metal wiring 2. Alternatively, once the first interlayer film 10 is filled to a certain degree between the adjacent stacked patterns of the third polycrystalline silicon film 5, the second polycrystalline silicon film 4, the first polycrystalline silicon film 3, and the first metal wiring 2 by using film formation conditions with excellent filling characteristics, the first interlayer film 10 may be filled between the adjacent stacked patterns of the second metal film 8a and the phase-change material 7 by using conditions with bad filling characteristics.

Figure 13:
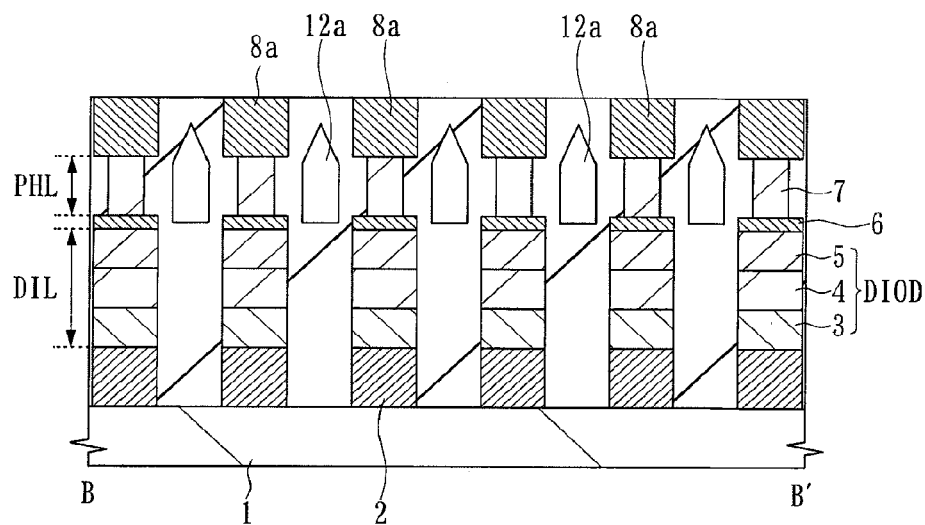
FIG. 13 is a cross-sectional view (B-B' line) of main parts of the phase-change memory in the manufacturing process continued from FIG. 11.
Figure 14:
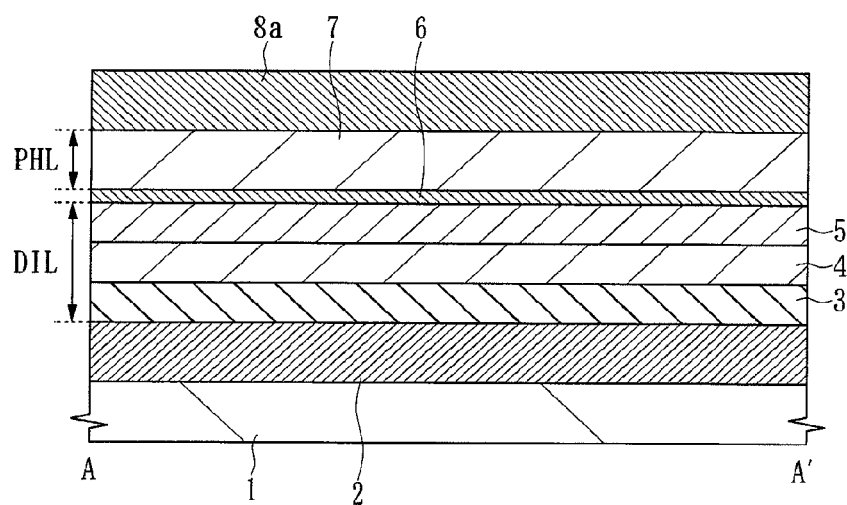
FIG. 14 is a cross-sectional view (A-A' line) of main parts of the phase-change memory in the manufacturing process continued from FIG. 11.

Next, as shown in FIGS. 12, 13 and 14, a CMP technique is used to polish a surface of the first interlayer film 10 to expose a surface of the second metal film 8a. FIG. 12 is a top view of the memory matrix, where only the second metal film 8a and the semiconductor substrate 1 are illustrated for facilitating understanding of the structure of the memory matrix. Further, FIG. 13 is a cross-sectional view of main parts of the memory matrix taken along the like B-B' of FIG. 12, and FIG. 14 is a cross-sectional view of main parts of the memory matrix taken along the line A-A' of FIG. 12.

Figure 15:
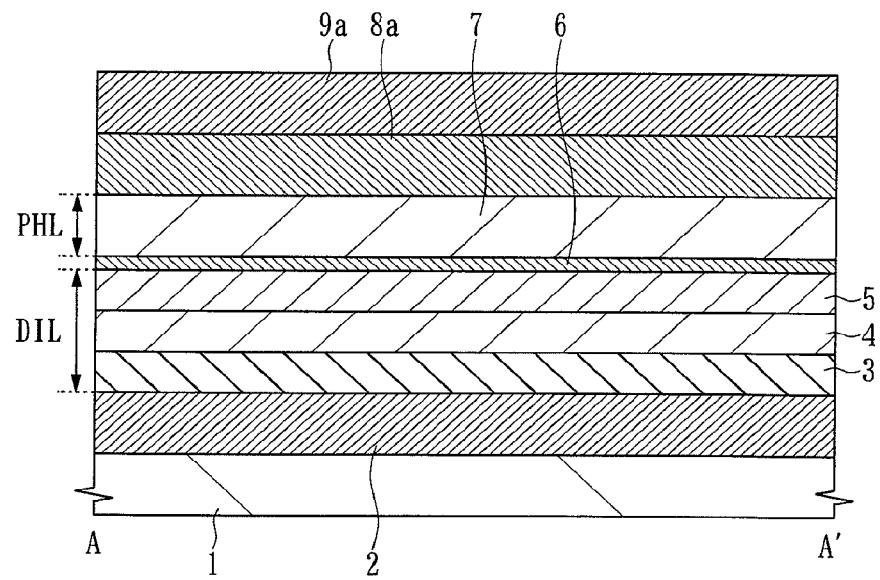
FIG. 15 is a cross-sectional view (A-A' line) of main parts of the phase-change memory in the manufacturing process continued from FIG. 12, FIG. 13, and FIG. 14.

Next, as shown in FIG. 15, the third metal film 9a is formed on the semiconductor substrate 1. A material of the third metal film 9a is W, for example, and can be formed by a CVD method or the like, for example. A total film thickness of the second metal film 8a and the third metal film 9a is preferred to be 200 nm or less, for example. When the film thickness is larger than 200 nm, the second metal film 8a and the third metal film 9a are difficult to process by dry etching.

Figure 16:
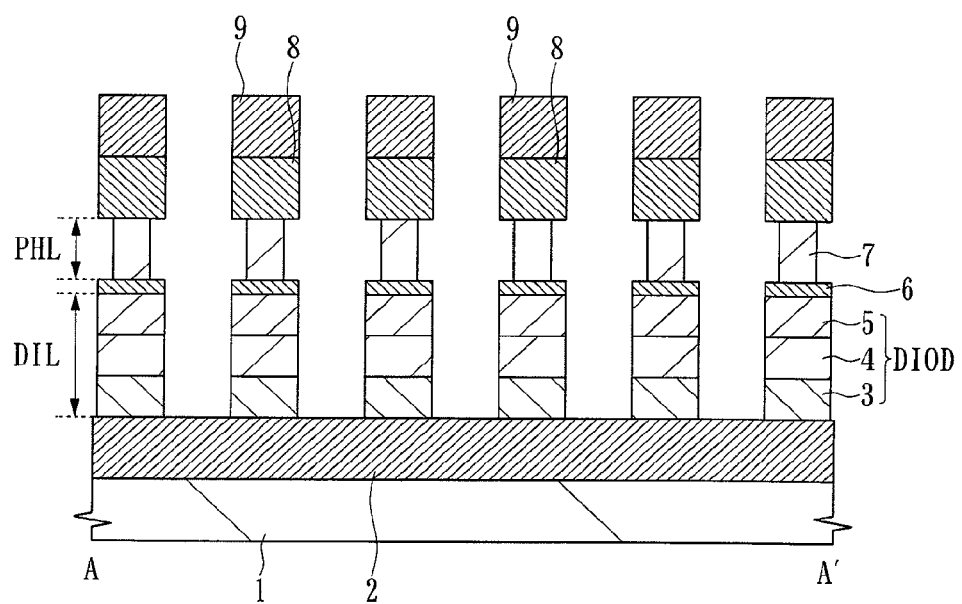
FIG. 16 is a cross-sectional view (A-A' line) of main parts of the phase-change memory in the manufacturing process continued from FIG. 15.

Next, as shown in FIG. 16, the lithography technique and the dry etching technique are used to sequentially process the third metal film 9a, the second metal film 8a, the phase-change material 7, the buffer layer 6, the third polycrystalline silicon film 5, the second polycrystalline silicon film 4, and the first polycrystalline silicon film 3 along a second direction. Thus, the third metal wiring 9 formed of the third metal film 9a is formed, and the plug-shaped second metal wiring 8 formed of the second metal film 8a is formed. Further, the diode DIOD is formed having a stacked structure including the third polycrystalline silicon film 5, the second polycrystalline silicon film 4, and the first polycrystalline silicon film 3. A stacked pattern of the third metal wiring 9, the second metal wiring 8, the phase-change material 7, the buffer layer 6, the third polycrystalline silicon film 5, the second polycrystalline silicon film 4, and the first polycrystalline silicon film 3 is a pattern of a bit line, and is formed into a stripe shape along the second direction orthogonal to the first direction and in parallel with the adjacent pattern. Further, the third metal wiring 9 is electrically connected (not shown) to the semiconductor substrate 1 including a peripheral circuit so that read and write operation of the phase-change memory can be performed. Further, similarly to the method explained above in FIGS. 8 to 10, the width of the phase-change material 7 is processed to be narrower than the widths of the lower buffer layer 6, the third polycrystalline silicon film 5, the second polycrystalline silicon film 4 and the first polycrystalline silicon film 3, and the widths of the third metal wiring 9 and the second metal wiring 8 are processed to be wider than the width of the phase-change material 7.

Thereafter, the second interlayer film 11 is formed on the semiconductor substrate 1. A material of the second interlayer film 11 is TEOS for example, and it can be formed by a CVD method or the like for example. Further, similarly to the voids 12a described above, the voids 12b are simultaneously formed between the adjacent stacked patterns of the third metal wiring 9, the second metal wiring 8, the phase-change material 7, the buffer layer 6, the third polycrystalline silicon film 5, the second polycrystalline silicon film 4, the first polycrystalline silicon film 3 and the first metal wiring 2. In this manner, the memory cell according to the first embodiment shown in FIGS. 1 to 5 described above is substantially completed. A filling ratio of the first interlayer film 10 between the memory cells is, for example, 75% or more in a plane connecting the center of gravity of the diode DIOD to the center of gravity of the diode DIOD in the adjacent memory cell, and a filling ratio of the second interlayer film 11 between the memory cells is, for example, in a range of 75% and 50% in a plane connecting the center of gravity of the phase-change material 7 to the phase-change material 7 in the adjacent memory cell.

Figure 17:
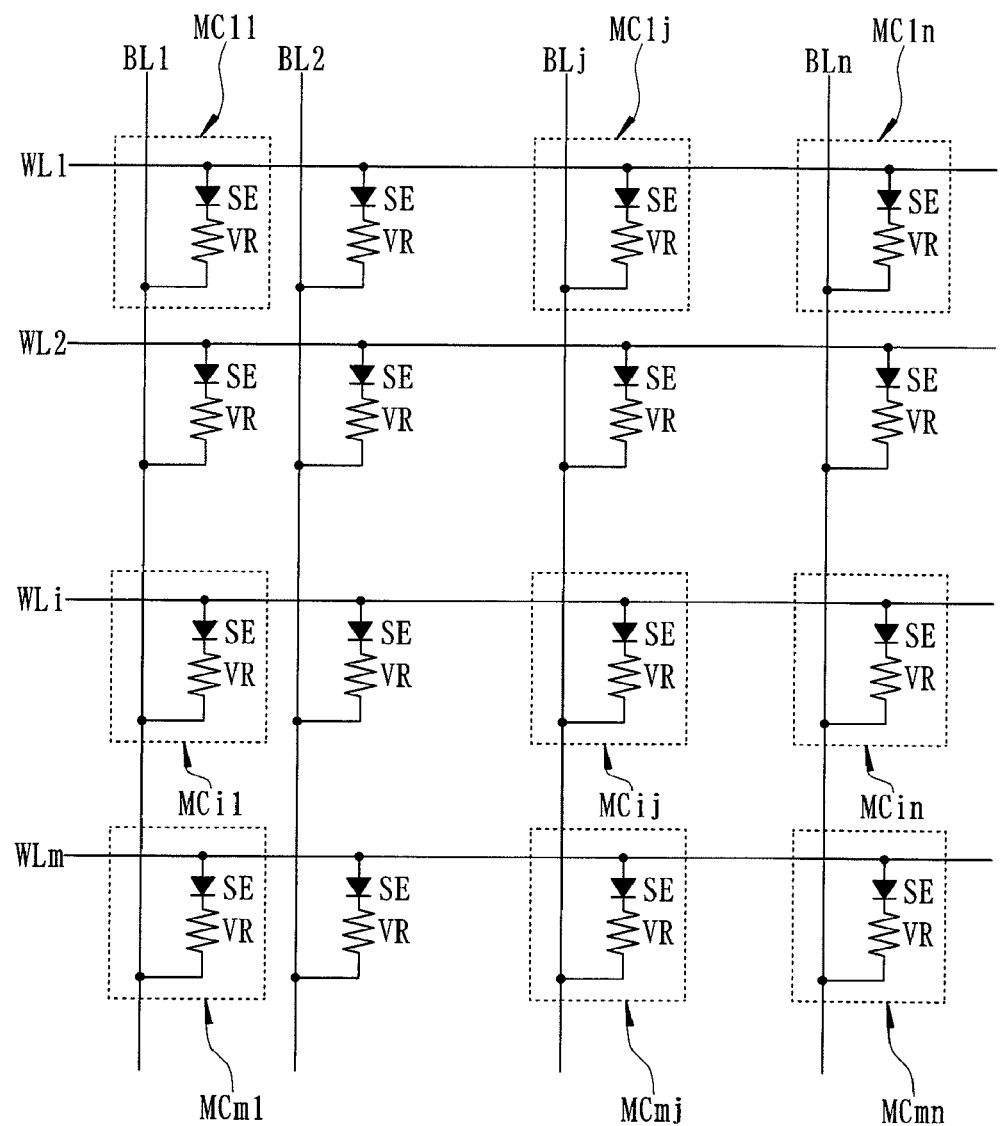
FIG. 17 is a configuration diagram of main parts of an equivalent circuit of the memory matrix of the first embodiment.

Next, a method of operation of the memory matrix according to the first embodiment of the present invention will be described with reference to FIG. 17. FIG. 17 is a configuration diagram of main parts of an equivalent circuit of the memory matrix. Memory cells MCij (i=1, 2, 3, . . . , m) (j=1, 2, 3, . . . , n) are arranged at intersection points of a plurality of first metal wirings arranged in parallel (hereinafter, word lines) WLi (i=1, 2, 3, . . . , m) with a plurality of third metal wirings (hereinafter, bit lines) BLj (j=1, 2, 3, . . . , n) arranged in parallel to be intersect with the word lines WLi. As shown in FIG. 1 described above, the diode DIOD and the phase-change material 7 are connected in series, and in FIG. 17, the diode DIOD corresponds to a selection element SE and the phase-change material 7 corresponds to a memory element VR.

Recording into the phase-change memory is performed in the following manner. For example, in a rewrite operation of the memory cell MC11, a voltage Vh is applied to the first word line WL1, a voltage Vl is applied to other word lines WLi, the voltage Vl is applied to the first bit line BL1, and the voltage Vh is applied to other bit lines BLj, so that a current is flowed to the memory element VR of the MC11 to store information. Here, Vh>Vl. At the time of the rewriting operation, the selection element SE having a rectifying operation is required in order to prevent erroneous writing into non-selective memory cells. Of course, the voltage Vh has to be smaller than or equal to a breakdown voltage of the selection element SE.

Reading of the nonvolatile memory is performed as follows. For example, when information in the memory cell MC11 is read, a voltage Vm is applied to the first word line WL1, the voltage Vl is applied to other word lines WLi and the voltage Vl is applied to the first bit line BL1 so that the information is read on the basis of a magnitude of the current flowing through the BL1.

It has been described in the first embodiment that the first metal wiring 2 is assumed as a word line and the third metal wiring 9 is assumed as a bit line, but the first metal wiring 2 may be assumed as a bit line and the third metal wiring 9 may be assumed as a word line.

Figure 18:
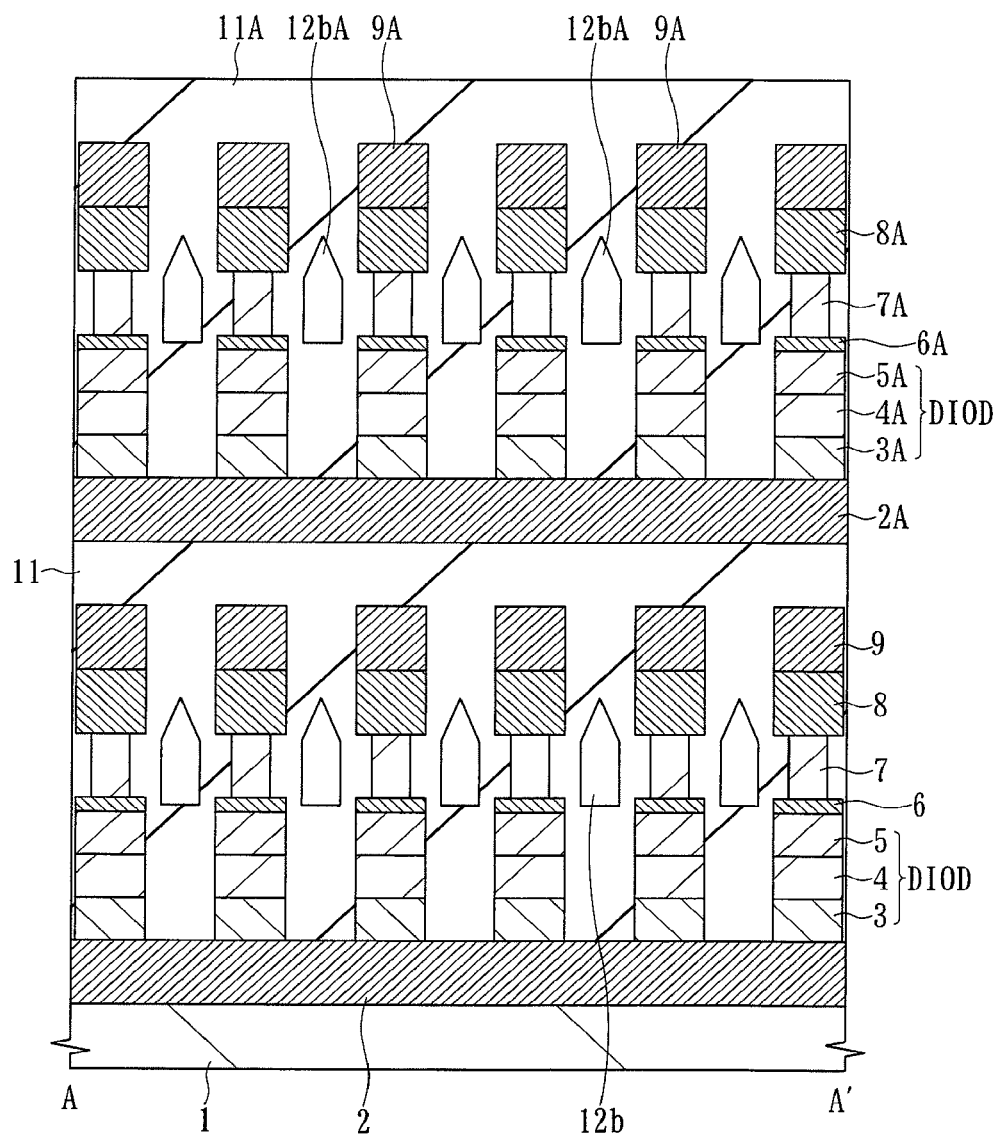
FIG. 18 is a cross-sectional view of main parts of the phase-change memory in the case where the memory matrix of the first embodiment is stacked into two layers.

It has been described the case in which the memory matrix is one layer, but a stack of the memory matrix is more preferable because the bit density of the memory cell can be increased. FIG. 18 shows a cross-sectional view of main parts of the phase-change memory in the case where the memory matrix according to the first embodiment is stacked into two layers. For example, the two-layer stack of the memory matrix can be realized similarly to the manufacturing method described above with reference to FIGS. 6 to 16 according to the first embodiment by forming: a first metal wiring 2A as word line at the second layer of the memory matrix; a first polycrystalline silicon film 3A at the second layer; a second polycrystalline silicon film 4A at the second layer; a third polycrystalline silicon film 5A at the second layer; a buffer layer 6A at the second layer; a phase-change material 7A at the second layer; a second metal wiring 8A at the second layer; a third metal wiring 9A at the second layer; a first interlayer film at the second layer (not shown); a second interlayer film 11A at the second layer; voids 12bA at the second layer; and the like on the structure shown in FIGS. 1 to 5 described above, that is, on the second interlayer film 11. Further, also when the memory matrix is stacked into "k" layers (k=1, 2, 3, . . . , 1), the memory matrix may be stacked in the similar manner.

Figure 19:
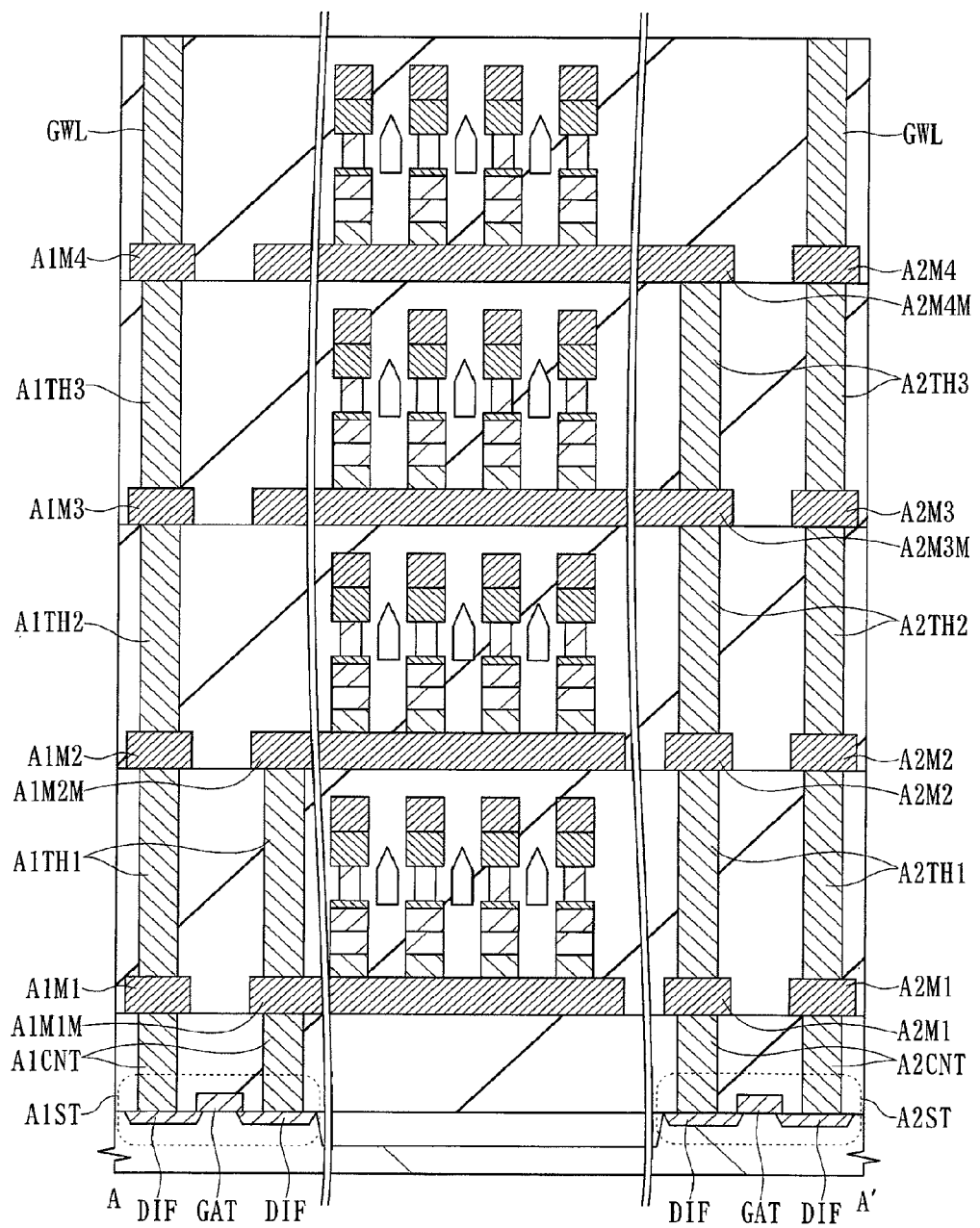
FIG. 19 is a cross-sectional view of main parts of the phase-change memory along a word-line pattern in the case where the memory matrix of the first embodiment is stacked into four layers.
Figure 20:
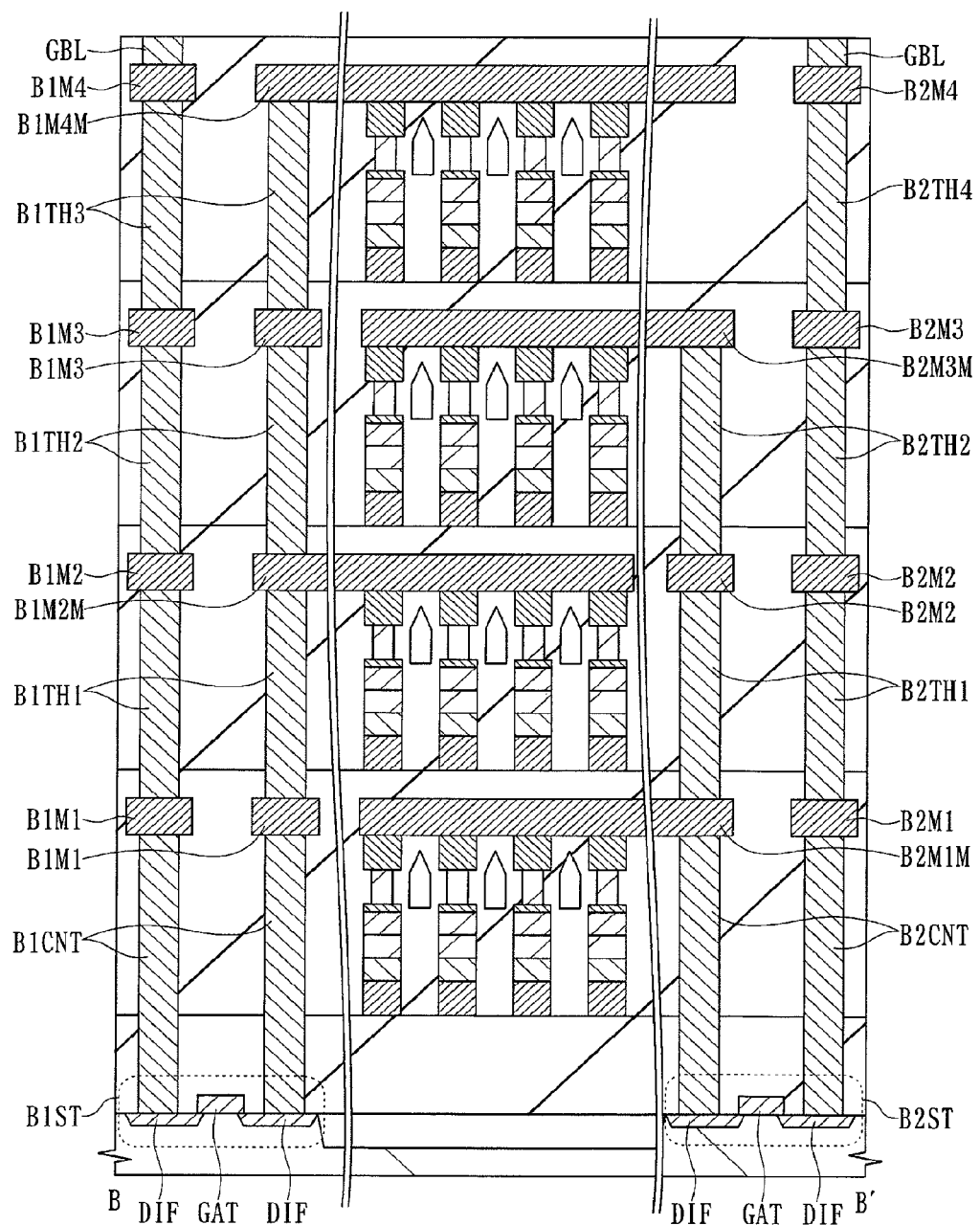
FIG. 20 is a cross-sectional view of main parts of the phase-change memory along a bit-line pattern in the case where the memory matrix of the first embodiment is stacked into four layers.

FIGS. 19 and 20 show cross-sectional views of main parts of the phase-change memory when the memory matrix according to the first embodiment is stacked into four layers. FIG. 19 is a cross-sectional view of main parts of the phase-change memory along a pattern (word line pattern) of a lower metal wiring A1M1M, a lower metal wiring A1M2M, a lower metal wiring A2M3M and a lower metal wiring A2M4M. FIG. 20 is a cross-sectional view of main parts of the phase-change memory along a pattern (bit line pattern) of an upper metal wiring B2M1M, an upper metal wiring B1M2M, an upper metal wiring B2M3M, and an upper metal wiring B1M4M. In the figures, A1ST, A2ST, B1ST and B2ST denote a transistor for selecting a layer formed by a CMOS (Complementary Metal Oxide Semiconductor) technique, for example, and a symbol DIF denotes a diffusion layer and GAT denotes a gate.

For example, connection with a peripheral circuit when stacking the memory matrix into four layers employs the structure of the memory matrix shown in FIGS. 19 and 20. For example, the transistor A1ST and the transistor B2ST may be selected when the first layer is selected, and the transistor A1ST and the transistor B1ST may be selected when the second layer is selected.

FIGS. 21 and 22 show cross-sectional views of main parts of the phase-change memory when the word lines and the bit lines according to the first embodiment are shared in each layer. The bit density is the same as the bit density of the structure described in FIGS. 19 and 20, but when the word lines and the bit lines are shared in each layer, masks necessary for the manufacture can be reduced, thereby reducing a manufacturing cost thereof.

Note that, line/space of the adjacent first metal wiring may be set at the same value as the line/space of the adjacent third metal wiring 9, and the line/space of the adjacent first metal wiring 2 may be set at a different value from the line/space of the adjacent third metal wiring 9. For example, the space of the adjacent third metal wiring 9 may be set to be wider than the space of the adjacent first metal wiring 2. In this case, the first interlayer film 10 is filled between the adjacent selection element and memory element along the second direction, and at the same time, the voids 12a are formed between the adjacent stacked patterns of the second metal film 8a, the phase-change material 7, the buffer layer 6, the third polycrystalline silicon film 5, the second polycrystalline silicon film 4, the first polycrystalline silicon film 3 and the first metal film wiring 2. Further, the second interlayer film 11 is filled between the adjacent selection element and memory element along the first direction, and at the same time, the voids 12b are formed between the adjacent stacked patterns of the third metal wiring 9, the second metal wiring 8, the phase-change material 7, the buffer layer 6, the third polycrystalline silicon film 5, the second polycrystalline silicon film 4 and the first polycrystalline silicon film 3. Therefore, a filled state upon forming the first interlayer film 10 may be different from a filled state upon forming the second interlayer film 11, and in some cases, the space of the adjacent third metal wiring 9 may be necessary to be wider than the space of the adjacent first metal wiring 2 in order to control the shape of the voids 12a and 12b.

In this manner, according to the first embodiment, the first interlayer film 10 or the second interlayer film 11 formed of, for example, TEOS is filled at the layer DIL in which the diode DIOD (stacked pattern of the third polycrystalline silicon film 5, the second polycrystalline silicon film 4 and the first polycrystalline silicon film 3) is provided. On the other hand, the first interlayer film 10 in which the voids 12a are formed or the second interlayer film 11 in which the voids 12b are formed is filled at the layer PHL in which the phase-change material 7 is provided, and it is thus possible to reduce a transfer of heat generated in the phase-change material 7 to the diode DIOD. Accordingly, even when the phase-change material 7 becomes a high temperature, it is possible to realize the memory cell structure in which the diode DIOD is less likely to be at a high temperature.

Second Embodiment

A memory matrix of a phase-change memory according to a second embodiment will be described with reference to FIGS. 23 to 25. FIG. 23 is a top view of the memory matrix, FIG. 24 is a cross-sectional view of main parts of the memory matrix taken along the line A-A' of FIG. 23, and FIG. 25 is a cross-sectional view of main parts of the memory matrix taken along the line B-B' of FIG. 23. In FIG. 23, only a third metal wiring 9, a first metal wiring 2, and a semiconductor substrate 1 are illustrated for facilitating understanding of the structure of the memory matrix. In the figures, similarly as in the first embodiment described above, reference numeral 1 denotes a semiconductor substrate and reference numeral 2 denotes a first metal wiring extending along a first direction.

Further, reference numeral 3 denotes a first polycrystalline silicon film, reference numeral 4 denotes a second polycrystalline silicon film, reference numeral 5 denotes a third polycrystalline silicon film, where the three layers form a diode DIOD as a selection element. Reference numeral 6 denotes a buffer layer (e.g., TiN), reference numeral 7 denotes a phase-change material (e.g., $Ge_2Sb_2Te_5$) as a memory element, reference numeral 8 denotes a second metal wiring (e.g., TiN), and reference numeral 9 denotes a third metal wiring. Furthermore, reference numeral 21 denotes a first interlayer film (e.g., TEOS), reference numeral 22 denotes a second interlayer film (e.g., porous MSQ (Methylsilses-quioxane)) which fills a space occurring due to a coating form of the first interlayer film, reference numeral 23 denotes a third interlayer film (e.g., TEOS), and reference numeral 24 denotes a fourth interlayer film (e.g., porous MSQ) which fills a space occurring due to a coating form of the third interlayer film. A thermal conductivity of TEOS is about 1.4 W/(m·K) and a thermal conductivity of porous MSQ is about 0.2 W/(m·K).

In the phase-change memory according to the second embodiment, the first interlayer film 21 or the third interlayer film 23 is present between the memory cells being adjacent at the layer DIL in which the diode DIOD is provided, and, the sidewall-shaped first interlayer film 21 and the second interlayer film 22 to fill a space occurring due to the sidewall shape of the first interlayer film 21, or the sidewall-shaped third interlayer film 23 and the fourth interlayer film 24 to fill a space occurring due to the sidewall shape of the third interlayer film 23 are present between the adjacent memory cells at the layer PHL in which the phase-change material 7 is provided. When a thermal conductivity of the first interlayer film 21 and the third interlayer film 23 is assumed to be $K_{f1}$ and a thermal conductivity of the second interlayer film 22 and the fourth interlayer film 24 is assumed to be $K_{f2}$, if $K_{f2}<K_{f1}$, a thermal conductivity $K_{P1}$ between the memory cells at the layer PHL in which the phase-change material 7 is provided is smaller than a thermal conductivity $K_{D1}$ between the memory cells at the layer DIL in which the diode DIOD is provided, thereby forming a memory cell having a structure in which the diode DIOD is less likely to be at a high temperature and the phase-change material 7 is likely to at a high temperature. To the contrary, if $K_{f2}>K_{f1}$, the thermal conductivity $K_{P1}$ between the memory cells in the layer PHL in which the phase-change material 7 is provided is larger than the thermal conductivity $K_{D1}$ between the memory cells in the layer DIL in which the diode DIOD is provided, but it is possible to form a memory cell in which the phase-change material 7 is cooled down more rapidly so that a high-speed operation is enabled. In the second embodiment, the materials between the memory cells in the layer PHL in which the phase-change material 7 is provided have been described by the two types of the first interlayer film 21 and the second interlayer film 22 or the two types of the third interlayer film 23 and the fourth interlayer film 24, but three or more types of materials may be used. Importantly, the thermal conductivity $K_{P1}$ between the memory cells in the layer PHL in which the phase-change material 7 is provided is different from the thermal conductivity $K_{D1}$ between the memory cells in the layer DIL in which the diode DIOD is provided.

Next, a method of manufacturing the phase-change memory according to the second embodiment will be described with reference to FIGS. 26 to 32. FIG. 29 is a top view of the memory matrix, FIGS. 26 to 28 and FIG. 30 are cross-sectional views of main parts of the memory matrix taken along the line B-B' of FIG. 23, and FIGS. 31 and 32 are cross-sectional views of main parts of the memory matrix taken along the line A-A' of FIG. 23.

At first, from the structure of the first embodiment described above shown in FIGS. 6 and 7, the lithography technique and the dry etching technique are used to sequentially process the second metal film 8a, the phase-change material 7, the buffer layer 6, the third polycrystalline silicon film 5, the second polycrystalline silicon film 4, the first polycrystalline silicon film 3 and the first metal film 2a into a stripe shape along the first direction. In this manner, as shown in FIG. 26, the first metal wiring 2 formed of the first metal film 2a is formed.

The widths of the second metal film 8a and the phase-change material 7 are preferably narrower than the widths of the lower buffer layer 6, the third polycrystalline silicon film 5, the second polycrystalline silicon film 4 and the first polycrystalline silicon film 3. This is directed for easily forming two or more types of interlayer films to be described later. A method of making the widths of the second metal film 8a and the phase-change material 7 narrower than other portions includes: a method in which the second metal film 8a and the phase-change material 7 are first processed to be thin by isotropic dry etching and then the buffer layer 6, the third polycrystalline silicon film 5, the second polycrystalline silicon film 4, the first polycrystalline silicon film 3 and the first metal film 2a are processed by anisotropic dry etching; a method in which, as shown in FIG. 9 according to the first embodiment described above, the second metal film 8a and the phase-change material 7 are sequentially processed by anisotropic dry etching and subsequently the second metal film 8a and the phase-change material 7 are processed to be thin by isotropic dry etching and then the buffer layer 6, the third polycrystalline silicon film 5, the second polycrystalline silicon film 4, the first polycrystalline silicon film 3 and the first metal film 2a are sequentially processed again by anisotropic dry etching; and the like.

Next, as shown in FIG. 27, the first interlayer film 21 is formed on the semiconductor substrate 1. The material of the first interlayer film 21 is TEOS for example, and can be formed by CVD or the like for example. The widths of the second metal film 8a and the phase-change material 7 are narrower than the widths of the buffer layer 6, the third polycrystalline silicon film 5, the second polycrystalline silicon film 4, the first polycrystalline silicon film 3 and the first metal wiring 2. Thus, the conditions under which the film is isotropically formed are used to form the first interlayer film 21 so that the first interlayer film 21 is filled between the adjacent stacked patterns of the buffer layer 6, the third polycrystalline silicon film 5, the second polycrystalline silicon film 4, the first polycrystalline silicon film 3 and the first metal wiring 2, but the sidewall-shaped first interlayer film 21 is formed between the adjacent stacked patterns of the second metal film 8a and the phase-change material 7 so that a space is formed instead of being filled with the first interlayer film 21.

Next, as shown in FIG. 28, the first interlayer film 21 is etched back until the surface of the second metal film 8a is exposed. Through the etching-back, the first interlayer film 21 filled between the adjacent stacked patterns of the buffer layer 6, the third polycrystalline silicon film 5, the second polycrystalline silicon film 4, the first polycrystalline silicon film 3 and the first metal wiring 2 can be removed more deeply, for example, down to around the buffer layer 6 so that a space in which the interlayer film 21 is not formed can be formed even between the adjacent stacked patterns of the second metal film 8a, the phase-change material 7 and the buffer layer 6.

In addition, as shown in FIGS. 29, 30 and 31, after the second interlayer film 22 is deposited on the semiconductor substrate 1, the CMP technique is used to polish the surface of the second interlayer film 22 to expose the surface of the second metal film 8a. The material of the second interlayer film 22 is porous MSQ, for example, and can be formed by a coating method, for example. In the second embodiment, the filling depth of the second interlayer film 22 can be adjusted by the etching-back so that materials having different thermal conductivities can be accurately arranged between the memory cells. FIG. 29 is a top view of the memory matrix, where only the second metal film 8a, the first metal wiring 2 and the semiconductor substrate 1 are illustrated for facilitating understanding of the structure of the memory matrix. FIG. 30 is a cross-sectional view of main parts of the memory matrix taken along the line B-B' of FIG. 29, and FIG. 31 is a cross-sectional view of main parts of the memory matrix taken along the line A-A' of FIG. 29.

Next, after a third metal film (same metal film as the third metal film 9a used in the first embodiment described above) is formed on the semiconductor substrate 1, the lithography technique and the dry etching technique are used to sequentially process the third metal film, the second metal film 8a, the phase-change material 7, the buffer layer 6, the third polycrystalline silicon film 5, the second polycrystalline silicon film 4 and the first polycrystalline silicon film 3 into a stripe shape along the second direction. In this manner, as shown in FIG. 32, the third metal wiring 9 formed of the third metal film is formed so that the plug-shaped second metal wiring 8 formed of the second metal film 8a is formed. The material of the third metal wiring 9 is W for example, and can be formed by a CVD method or the like, for example. A total film thickness of the second metal wiring 8 and the third metal wiring 9 is preferably 200 nm or less. If it is too thick, the processing becomes difficult.

Thereafter, similarly as the manufacturing method described above with reference to FIGS. 27 to 31, the third interlayer film 23 and the fourth interlayer film 24 are formed. In this manner, the phase-change memory according to the second embodiment shown in FIGS. 23 to 25 described above is substantially completed. The filling ratio of the second interlayer film 22 or the fourth interlayer film 24 between the memory cells is 25% or less in a plane connecting the center of gravity of the diode DIOD to the center of gravity of the diode DIOD in the adjacent memory cell, and the filling ratio of the second interlayer film 22 or the fourth interlayer film 24 between the memory cells is between 50% and 25% in a plane connecting the center of gravity of the phase-change material 7 to the center of gravity of the phase-change material 7 in the adjacent memory cell.

A method of operation of the memory matrix according to the second embodiment is similar to the first embodiment described above.

While it has been described the case in which the memory matrix is one layer in the foregoing, stacking of the memory matrix to enhance the bit density is more preferred because it reduces the manufacturing cost. FIG. 33 is a cross-sectional view of main parts of the phase-change memory when the memory matrix according to the second embodiment is stacked into two layers. For example, the stack of the memory matrix into two layers can be realized similarly as that in the method described with FIGS. 26 to 32 above for the second embodiment by forming a first metal wiring 2A as word line at the second layer of the memory matrixes, a first polycrystalline silicon film 3A at the second layer, a second polycrystalline silicon film 4A at the second layer, a third polycrystalline silicon film 5A at the second layer, a buffer layer 6A at the second layer, a phase-change material 7A at the second layer, a second metal wiring 8A at the second layer, a third metal wiring 9A at the second layer, a first interlayer film at the second layer (not shown), a second interlayer film at the second layer (not shown), a third interlayer film 23A at the second layer, and a fourth interlayer film 24A at the second layer on the structure shown in FIGS. 23 to 25 described above, that is, on the fourth interlayer film 24. Further, also when the memory matrix is stacked into k layers (k=1, 2, 3, . . . , 1), the memory matrix may be stacked in the similar way.

FIGS. 34 and 35 are cross-sectional views of main parts of the phase-change memory in the case where the memory matrix according to the second embodiment is stacked into four layers. FIG. 34 is a cross-sectional view of main parts of the phase-change memory along a pattern (word line pattern) of a lower metal wiring A1M1M, a lower metal wiring A1M2M, a lower metal wiring A2M3M and a lower metal wiring A2M4M, and FIG. 35 is a cross-sectional view of main parts of the phase-change memory along a pattern (bit line pattern) of an upper metal wiring B2M2M, an upper metal wiring B1M3M, an upper metal wiring B2M4M and an upper metal wiring B1M5M. In the figures, A1ST, A2ST, B1ST and B2ST denote a transistor for selecting a layer formed by using the CMOS technique, for example, and a symbol DIF denotes a diffusion layer and GAT denotes a gate in the figures.

Connections to peripheral circuits when the memory matrix is stacked into, for example, four layers, has the structure of the memory matrix shown in FIGS. 34 and 35. For example, when the first layer is selected, the transistor A1ST and the transistor B2ST may be selected, while when the second stage is selected, the transistor A1ST and the transistor B1ST may be selected.

In the case an interlayer film is filled between the memory cells according to the second embodiment, there has been employed, as described with reference to FIGS. 27 to 30 above, the manufacturing steps of: forming the first interlayer film 21; processing the first interlayer film 21 by the etching method; filling a space occurring due to the formation of the first interlayer film 21 with the second interlayer film 22; and processing the second interlayer film 22 by the CMP method. Meanwhile, the method is not limited to this. For example, manufacturing steps to be described later may be employed in place of the manufacturing steps.

At first, as shown in FIG. 36, the first interlayer film 21 is formed on the semiconductor substrate 1. At this time, the first interlayer film 21 is completely filled between the adjacent stacked patterns of the second metal film 8a, the phase-change material 7, the buffer layer 6, the third polycrystalline silicon film 5, the second polycrystalline silicon film 4, the first polycrystalline silicon film 3, and the first metal wiring 2. The material of the first interlayer film 21 is TEOS, for example. Subsequently, the first interlayer film 21 is etched back down to around the buffer layer G. The second metal film 8a and the phase-change material 7 are exposed through the etching-back.

Next, as shown in FIG. 37, the second interlayer film 22 is formed on the semiconductor substrate 1 so that the second interlayer film 22 is completely filled between the adjacent stacked patterns of the second metal film 8a and the phase-change material 7. Thereafter, the CMP technique is used to polish the surface of the second interlayer film 22 to expose the surface of the second metal film 8a. The material of the second interlayer film 22 is porous MSQ for example, and can be formed by a coating method for example.

By using the above-described manufacturing method, the second interlayer film 22 having a lower thermal conductivity than the first interlayer film 21 can be completely filled between the adjacent stacked patterns of the second metal film 8a and the phase-change material 7.

In this manner, according to the second embodiment, since a thermal conductivity between the memory cells at the layer DIL in which the diode DIOD (stacked pattern of the third polycrystalline silicon film 5, the second polycrystalline silicon film 4, and the first polycrystalline silicon film 3) is provided may be set at a different value from a thermal conductivity between the memory cells at the layer PHL in which the phase-change material 7 is provided, an optimum design of the phase-change memory having desired characteristics can be facilitated. For example, the first interlayer film 21 or the third interlayer film 23 formed of, for example, TEOS is filled at the layer DIL in which the diode DIOD (stacked pattern consisting of the third polycrystalline silicon film 5, the second polycrystalline silicon film 4, and the first polycrystalline silicon film 3) is provided, for example, and the first interlayer film 21 formed of, for example, TEOS and the second interlayer film 22 formed of porous MSQ, or the third interlayer film 23 formed of TEOS and the fourth interlayer film 24 formed of porous MSQ can be filled at the layer PHL in which the phase-change material 7 is provided. Since the interlayer film formed of porous MSQ having a lower thermal conductivity than TEOS is provided at the layer PHL in which the phase-change material 7 is provided, it is possible to reduce the transfer of the heat generated in the phase-change material 7 to the diode DIOD as compared with the case in which only the interlayer film formed of TEOS is provided. In this manner, even when the phase-change material 7 is at a high temperature, it is possible to realize the phase-change memory cell in which the diode DIOD is less likely to be at a high temperature.

Third Embodiment

A memory matrix of a phase-change memory according to a third embodiment will be described with reference to FIGS. 38 to 40. FIG. 38 is a top view of the memory matrix, FIG. 39 is a cross-sectional view of main parts of the memory matrix taken along the line A-A' of FIG. 38, and FIG. 40 is a cross-sectional view of main parts of the memory matrix taken along the line B-B' of FIG. 38. In FIG. 38, only a third metal wiring, a first metal wiring, and a semiconductor substrate are illustrated for facilitating understanding of a structure of the memory matrix. In the figures, similarly as those in the first embodiment described above, reference numeral 1 denotes a semiconductor substrate and reference numeral 2 denotes a first metal wiring extending along a first direction. Further, reference numeral 3 denotes a first polycrystalline silicon film, reference numeral 4 denotes a second polycrystalline silicon film, reference numeral 5 denotes a third polycrystalline silicon film, and these three layers form a diode DIOD as a selection element. Further, reference numeral 6 denotes a buffer layer (e.g., TiN), reference numeral 7 denotes a phase-change material (e.g., $Ge_2Sb_2Te_5$) as a memory element, reference numeral 8 denotes a second metal wiring (e.g., TiN), and reference numeral 9 denotes a third metal wiring. Reference numeral 31 denotes a first interlayer film (e.g., TEOS), reference numeral 32 denotes a second interlayer film (e.g., porous MSQ) fill a space occurring due to a coating form of the first interlayer film, reference numeral 33 denotes a third interlayer film (e.g., TEOS), and reference numeral 34 denotes a fourth interlayer film (e.g., porous MSQ) to fill a space occurring due to a coating shape of the third interlayer film.

In the phase-change memory according to the third embodiment, the first interlayer film 31 or the third interlayer film 33 is present between the adjacent memory cells at a layer DIL in which a diode DIOD is provided, and the sidewall-shaped first interlayer film 31 and the second interlayer film 32 to fill a space occurring due to the sidewall shape of the first interlayer film 31, or the sidewall-shaped third interlayer film 33 and the fourth interlayer film 34 to fill a space occurring due to the sidewall shape of the third interlayer film 33 are present between the adjacent memory cells at a layer PHL in which the phase-change material 7 is provided. Therefore, similarly to that in the second embodiment described above, a thermal conductivity between the memory cells at the layer PHL in which the phase-change material 7 is provided may be set at a different value from a thermal conductivity between the memory cells at the layer DIL in which the diode DIOD is provided. For example, when a thermal conductivity of the first interlayer film 31 and the third interlayer film 33 is assumed to be $K_{I3}$ and a thermal conductivity of the second interlayer film 32 and the fourth interlayer film 34 is assumed to be $K_{I4}$, if $K_{I4} > K_{I3}$, a thermal conductivity $K_{P2}$ between the memory cells at the layer PHL in which the phase-change material 7 is provided is smaller than a thermal conductivity $K_{D2}$ between the memory cells at the layer DIL in which the diode DIOD is provided, thereby forming a memory cell having the structure in which the diode DIOD is less likely to be at a high temperature and the phase-change material 7 is likely to at a high temperature.

Next, a method for manufacturing the phase-change memory according to the third embodiment will be described with reference to FIGS. 41 to 46. FIG. 43 is a top view of the memory matrix, FIGS. 41, 42 and 44 are cross-sectional views of main parts of the memory matrix taken along the line B-B' of FIG. 38, and FIGS. 45 and 46 are cross-sectional views of main parts of the memory matrix taken along the line A-A' of FIG. 38.

At first, as shown in FIG. 41, from the structure of the first embodiment described above shown in FIGS. 6 and 7, the lithography technique and the dry etching technique are used to sequentially process the second metal film 8a, the phase-change material 7, the buffer layer 6, the third polycrystalline silicon film 5, the second polycrystalline silicon film 4, the first polycrystalline silicon film 3, and the first metal film 2a into a stripe shape along the first direction. In this manner, the first metal wiring 2 formed of the first metal film 2a is formed.

The widths of the second metal film 8a and the phase-change material 7 are similar as those in the second embodiment described above. Further, a similar method as that in the second embodiment described above can be employed as a method for making the widths of the second metal film 8a and the phase-change material 7 narrower than other portions. However, the difference from the second embodiment described above is in that the buffer layer 6 is tapered (tilted). In other words, in the second embodiment described above, the widths of the buffer layer 6, the third polycrystalline silicon film 5, the second polycrystalline silicon film 4, the first polycrystalline silicon film 3 and the first metal wiring 2 are the same, while in the third embodiment, the widths of the third polycrystalline silicon film 5, the second polycrystalline silicon film 4, the first polycrystalline silicon film 3 and the first metal wiring 2 are the same but the width of the upper side of the buffer layer 6 is processed to be narrower than the width of the lower side of the buffer layer 6.

Next, as shown in FIG. 42, the first interlayer film 31 is formed on the semiconductor substrate 1. A material of the first interlayer film 31 is TEOS for example, and can be formed by a CVD method or the like for example. The widths of the second metal film 8a and the phase-change material 7 are narrower than the widths of the buffer layer 6, the third polycrystalline silicon film 5, the second polycrystalline silicon film 4, the first polycrystalline silicon film 3, and the first metal wiring 2. Thus, conditions under which the film is isotropically formed are used to form the first interlayer film 31 so that the first interlayer film 31 is filled between the adjacent stacked patterns of the buffer layer 6, the third polycrystalline silicon film 5, the second polycrystalline silicon film 4, the first polycrystalline silicon film 3 and the first metal wiring 2, but the sidewall-shaped first interlayer film 31 is formed between the adjacent stacked patterns of the second metal film 8a and the phase-change material 7 and a space is formed without being filled with the first interlayer film 31.

Further, since the buffer layer 6 is tapered, the space formed between the adjacent stacked patterns of the second metal film 8a and the phase-change material 7 can be formed deeper than that in the case of forming the first interlayer film 21 in the second embodiment described above, for example, down to around the buffer layer 6.

Next, as shown in FIGS. 43, 44 and 45, after the second interlayer film 32 is deposited on the semiconductor substrate 1, a CMP technique is used to polish the surface of the second interlayer film 32 to expose the surface of the second metal film 8a. A material of the second interlayer film 32 is porous MSQ for example, and can be formed by a coating method for example. FIG. 43 is a top view of the memory matrix, where only the second metal film 8a, the first metal wiring 2 and the semiconductor substrate 1 are illustrated for facilitating understanding of the structure of the memory matrix. FIG. 44 is a cross-sectional view of main parts of the memory matrix taken along the line B-B' of FIG. 43, and FIG. 45 is a cross-sectional view of main parts of the memory matrix taken along the line A-A' of FIG. 43.

In the second embodiment described above, the first interlayer film 21 has been etched back to adjust the filling depth of the second interlayer film 22 before the second interlayer film 22 is formed. Meanwhile, in the third embodiment, since the buffer layer 6 is tapered to adjust the filling depth of the second interlayer film 32 when forming the first interlayer film 31, the first interlayer film 31 is not necessary to be etched back unlike in the second embodiment described above. Thus, since the number of manufacturing steps can be reduced, the manufacturing cost can be reduced more than the second embodiment described above.

Next, as shown in FIG. 46, after a third metal film (same metal film as the third metal film 9a used in the first embodiment described above) is formed on the semiconductor substrate 1, the lithography technique and the dry etching technique are used to sequentially process the third metal film, the second metal film 8a, the phase-change material 7, the buffer layer 6, the third polycrystalline silicon film 5, the second polycrystalline silicon film 4, and the first polycrystalline silicon film 3 into a stripe shape along the second direction. In this manner, the third metal wiring 9 formed of the third metal film is formed so that the plug-shaped second metal wiring 8 formed of the second metal film 8a is formed. A material of the third metal wiring 9 is W for example, and can be formed by a CVD method or the like for example. A total film thickness of the second metal wiring 8 and the third metal wiring 9 is preferably 200 nm or less. If the thickness is too large, the processing becomes difficult.

Thereafter, the third interlayer film 33 and the fourth interlayer film 34 are formed similarly as those in the manufacturing method described with reference to FIGS. 41 to 45 described above. In this manner, the phase-change memory according to the third embodiment shown in FIGS. 38 to 40 described above is substantially completed. A filling ratio of the second interlayer film 32 or the fourth interlayer film 34 between the memory cells is 25% or less in a plane connecting the center of gravity of the diode DIOD to the center of gravity of the diode DIOD in the adjacent memory cell, and a filling ratio of the second interlayer film 32 or the fourth interlayer film 34 between the memory cells is in a range of 50% to 25% in a plane connecting the center of gravity of the phase-change material 7 to the center of gravity of the phase-change material 7 in the adjacent memory cell.

A method of operation of the memory matrix and a method of connecting to a peripheral circuit according to the third embodiment are similar as those in the first embodiment described above. Further, the memory matrix may be stacked into several layers similarly as in the second embodiment described above.

As described in the foregoing, according to the third embodiment, the effects similar as those in the second embodiment described above can be obtained. Further, since the number of manufacturing steps can be reduced as compared with the second embodiment described above, the manufacturing cost can be reduced.

Fourth Embodiment

A memory matrix of a phase-change memory according to a fourth embodiment will be described with reference to FIGS. 47 to 49. FIG. 47 is a top view of the memory matrix, FIG. 48 is a cross-sectional view of main parts of the memory matrix taken along the line A-A' of FIG. 47, and FIG. 49 is a cross-sectional view of main parts of the memory matrix taken along the line B-B' of FIG. 47. In FIG. 47, only a third metal wiring, a first metal wiring, and a semiconductor substrate are illustrated for facilitating understanding of a structure of the memory matrix. In the figures, similarly as those in the first embodiment described above, reference numeral 1 denotes a semiconductor substrate and reference numeral 2 denotes a first metal wiring extending along the first direction. Reference numeral 3 denotes a first polycrystalline silicon film, reference numeral 4 denotes a second polycrystalline silicon film, reference numeral 5 denotes a third polycrystalline silicon film, and the three layers form a diode DIOD as selection element. Further, reference numeral 7 denotes a phase-change material (e.g., $Ge_2Sb_2Te_5$) as memory element, reference numeral 8 denotes a second metal wiring (e.g., TiN), and reference numeral 9 denotes a third metal wiring. Furthermore, reference numerals 41a and 41b denote a buffer layer (e.g., TiN), reference numeral 42 denotes a first interlayer film (e.g., TEOS), reference numeral 43 denotes a second interlayer film (e.g., TEOS), reference numeral 44 denotes a third interlayer film (e.g., porous MSQ), and reference numeral 45 denotes a fourth interlayer film (e.g., porous MSQ).

In the phase-change memory according to the fourth embodiment, the first interlayer film 42 or the second interlayer film 43 is present between the adjacent memory cells at a layer DIL in which the diode DIOD is provided, and the third interlayer film 44 or the fourth interlayer film 45 is present between the adjacent memory cells at a layer PHL in which the phase-change material 7 is provided. Therefore, similarly to the second embodiment or the third embodiment described above, a thermal conductivity between the memory cells at the layer PHL in which the phase-change material 7 is provided may be set at a different value from a thermal conductivity between the memory cells at the layer DIL in which the diode DIOD is provided. For example, when a thermal conductivity of the first interlayer film 42 and the second interlayer film 43 is assumed as $K_{I5}$ and a thermal conductivity of the third interlayer film 44 and the fourth interlayer film 45 is assumed as $K_{I6}$, if $K_{I6} < K_{I5}$, it is possible to form a memory cell having a structure in which the diode DIOD is less likely to be at a high temperature and the phase-change material 7 is likely to at a high temperature.

Next, a method of manufacturing the phase-change memory according to the fourth embodiment will be described with reference to FIGS. 50 to 56. FIGS. 50, 53 and 55 are top views of the memory matrix, FIG. 51 is a cross-sectional view of main parts of the memory matrix taken along the line B-B' of FIG. 50, FIG. 52 is a cross-sectional view of main parts of the memory matrix taken along the line A-A' of FIG. 50, FIG. 54 is a cross-sectional view of main parts of the memory matrix taken along the line A-A' of FIG. 53, and FIG. 56 is a cross-sectional view of main parts of the memory matrix taken along the line A-A' of FIG. 55.

At first, as shown in FIGS. 50, 51 and 52, the first metal film 2*a*, the first polycrystalline silicon film 3, the second polycrystalline silicon film 4, the third polycrystalline silicon film 5, and the buffer layer 41*a* are sequentially formed on the semiconductor substrate 1. Subsequently, the lithography technique and the dry etching technique are used to sequentially process the buffer layer 41*a*, the third polycrystalline silicon film 5, the second polycrystalline silicon film 4, the first polycrystalline silicon film 3, and the first metal film 2*a* into a stripe shape along the first direction. In this manner, the first metal wiring 2 formed of the first metal film 2*a* is formed. Subsequently, the first interlayer film 42 is formed on the semiconductor substrate 1. A material of the first interlayer film 42 is TEOS for example, and can be formed by a CVD method or the like for example. Subsequently, the CMP technique is used to polish the surface of the first interlayer film 42 to expose the surface of the buffer layer 41*a*. FIG. 50 is a top view of the memory matrix, where only the first interlayer film 42 and the buffer layer 41*a* are illustrated for facilitating understanding of the structure of the memory matrix.

Next, as shown in FIG. 53 and FIG. 54, the lithography technique and the dry etching technique are used along the second direction to sequentially process the buffer layer 41*a*, the third polycrystalline silicon film 5, the second polycrystalline silicon film 4, and the first polycrystalline silicon film 3 into a stripe shape. Subsequently, the second interlayer film 43 is formed on the semiconductor substrate 1. A material of the second interlayer film 43 is TEOS for example, and can be formed by a CVD method or the like for example. Subsequently, the CMP technique is used to polish the surface of the second interlayer film 43 to expose the surface of the buffer layer 41*a*. FIG. 53 is a top view, where only the second interlayer film 43, the first interlayer film 42 and the buffer layer 41*a* are illustrated for facilitating understanding of the structure of the memory matrix.

Next, as shown in FIGS. 55 and 56, the buffer layer 41*b*, the phase-change material 7 and the second metal film 8*a* are sequentially formed on the semiconductor substrate 1. Subsequently, the lithography technique and the dry etching technique are used to sequentially process the second metal film 8*a*, the phase-change material 7 and the buffer layer 41*b* into a stripe shape along the first direction. Subsequently, the third interlayer film 44 is formed on the semiconductor substrate 1. A material of the third interlayer film 44 is porous MSQ for example, and can be formed by a coating method or the like for example. Subsequently, the CMP technique is used to polish the surface of the third interlayer film 44 to expose the surface of the buffer layer 41*b*. FIG. 55 is a top view, where only the second metal film 8*a* and the third interlayer film 44 are illustrated for facilitating understanding of the structure of the memory matrix.

Next, a third metal film (same metal film as the third metal film 9*a* used in the first embodiment described above) is formed on the semiconductor substrate 1, and the lithography technique and the dry etching technique are used to sequentially process the third metal film, the second metal film 8*a*, the phase-change material 7, and the buffer layer 41*b* along the second direction. Subsequently, the fourth interlayer film 45 is formed on the semiconductor substrate 1. A material of the fourth interlayer film 45 is porous MSQ for example, and can be formed by a coating method or the like for example. Subsequently, the CMP technique is used to polish and planarize the surface of the fourth interlayer film 44. In this manner, the phase-change memory according to the fourth embodiment shown in FIGS. 47 to 49 described above is substantially completed.

A method of operation of the memory matrix and a method for connecting to a peripheral circuit according to the fourth embodiment are similar as those in the first embodiment described above. Further, the memory matrix may be stacked into several layers similarly as that in the second embodiment described above.

In this manner, according to the fourth embodiment, a thermal conductivity between the memory cells at the layer DIL in which the diode DIOD (stacked pattern of the third polycrystalline silicon film 5, the second polycrystalline silicon film 4, and the first polycrystalline silicon film 3) is provided may be set at a different value from a thermal conductivity between the memory cells at the layer PHL in which the phase-change material 7 is provided, thereby facilitating the optimum design of the phase-change memory having desired characteristics. For example, the first interlayer film 42 or the second interlayer film 43 formed of, for example, TEOS is filled at the layer DIL in which the diode DIOD (stacked pattern of the third polycrystalline silicon film 5, the second polycrystalline silicon film 4, and the first polycrystalline silicon film 3) is provided, and the third interlayer film 44 or the fourth interlayer film 45 formed of, for example, porous MSQ is filled at the layer PHL in which the phase-change material 7 is provided. The interlayer film formed of porous MSQ having a lower thermal conductivity than the interlayer film formed of TEOS is provided at the layer PHL in which the phase-change material 7 is provided, thereby reducing the transfer of the heat generated in the phase-change material 7 to the diode DIOD. In this manner, it is possible to realize a phase-change memory cell in which the diode DIOD is less likely to be at a high temperature even when the phase-change material 7 becomes a high temperature.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, also in the case where two or more types of interlayer films are formed in the layer in which the phase-change material is provided and voids are provided according to a combination of the first and second embodiments described above, similar effects as those in the present invention can be obtained.

The present invention can be applied to a nonvolatile memory device in which a phase-change material is used as a memory material.

What is claimed is:
1. A nonvolatile memory device comprising:
a semiconductor substrate;
a plurality of first metal wirings provided on the semiconductor substrate and extending along a first direction and being electrically connected to a peripheral circuit;

a plurality of third metal wirings extending along a second direction orthogonal to the first direction;

memory cells provided at intersections between the plurality of first metal wirings and the plurality of third metal wirings, the memory cells forming an array and including selection elements provided on the first metal wirings and being electrically connected to the first metal wirings;

memory elements provided on the selection elements, the memory elements being electrically connected to the selection elements; and second metal wirings provided on the memory elements and being electrically connected to the memory elements;

the third metal wirings provided on the second metal wirings and being electrically connected to the second metal wirings and peripheral circuit; and a first interlayer film having a first thermal conductivity and provided on side surfaces of the memory elements and between adjacent selection elements and not provided between adjacent memory elements; and a second interlayer film having a second thermal conductivity provided in a void formed by the first interlayer film having the first thermal conductivity;

the second thermal conductivity being lower than the first thermal conductivity.

2. The nonvolatile memory device according to claim 1, wherein the selection elements are diodes and the memory elements are phase-change materials.

3. The nonvolatile memory device according to claim 1, wherein the first interlayer film having the first thermal conductivity is formed of TEOS and the second interlayer film having the second thermal conductivity is formed of porous MSQ.

4. The nonvolatile memory device according to claim 1, wherein a filling ratio of the second interlayer film having the second thermal conductivity between the adjacent selection elements is 25% or less in a plane connecting the center of gravity of the selection element to the center of gravity of the adjacent selection element, and a filling ratio of the second interlayer film having the second thermal conductivity between the adjacent memory elements is in a range of 50% to 25% in a plane connecting the center of gravity of the memory element to the center of gravity of the adjacent memory element.

5. The nonvolatile memory device according to claim 1, wherein a buffer layer is formed between the selection elements and the memory elements.

* * * * *